United States Patent [19]

Lancaster

[11] 4,363,531
[45] Dec. 14, 1982

[54] ELECTRICAL JACK AND PATCH CORD ASSEMBLIES

[75] Inventor: Jesse F. Lancaster, Great Falls, Va.

[73] Assignee: Dynatech Laboratories, Incorporated, Alexandria, Va.

[21] Appl. No.: 213,630

[22] Filed: Dec. 5, 1980

Related U.S. Application Data

[60] Division of Ser. No. 955,233, Oct. 27, 1978, Pat. No. 4,256,936, which is a continuation-in-part of Ser. No. 650,019, Jan. 18, 1976, Pat. No. 4,140,918, which is a continuation-in-part of Ser. No. 420,584, Nov. 30, 1973, abandoned.

[51] Int. Cl.³ ............................................. H01R 13/58
[52] U.S. Cl. ................................. 339/107; 339/210 M
[58] Field of Search ................... 339/107, 105, 103 R, 339/103 M, 210 M

[56] References Cited

U.S. PATENT DOCUMENTS 1,157,026  10/1915  Meschenmoser .................. 339/107

FOREIGN PATENT DOCUMENTS 2001293  7/1971  Fed. Rep. of Germany ...... 339/107

*Primary Examiner*—Eugene F. Desmond
*Attorney, Agent, or Firm*—LeBlanc, Nolan, Shur & Nies

[57] ABSTRACT

An electrical jack having at least one socket for receiving an edge connector, a printed circuit board structure having an end portion extending into the socket for reception in the connector upon insertion of the connector into the socket, and switching means normally conditioned to cooperate with a printed circuit on the printed circuit board for electrically connecting a first set of jack terminals to a second set of jack terminals, the switching means extending into the jack's socket for actuation by insertion of the connector into the socket to electrically disconnect the two sets of terminals from each other.

2 Claims, 41 Drawing Figures

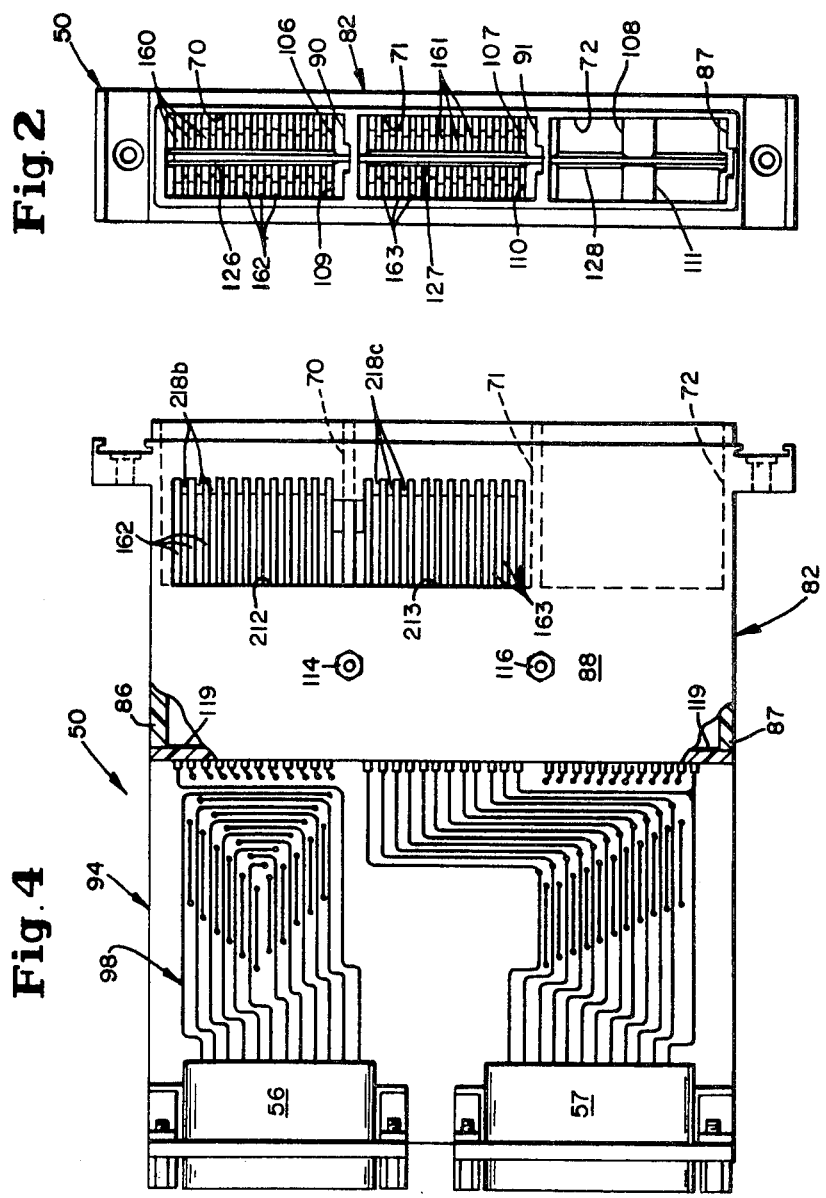

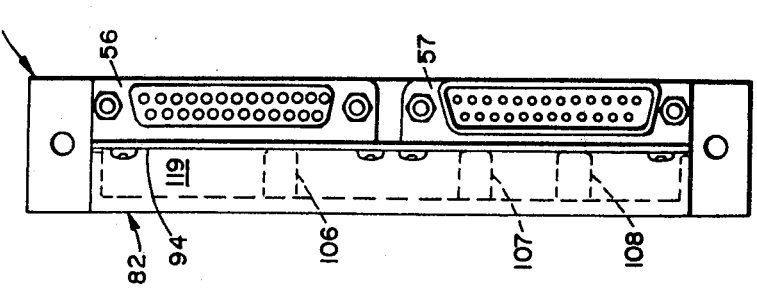
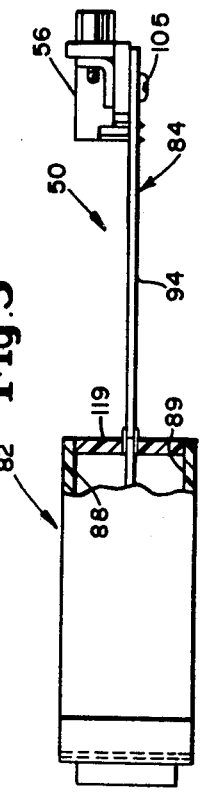
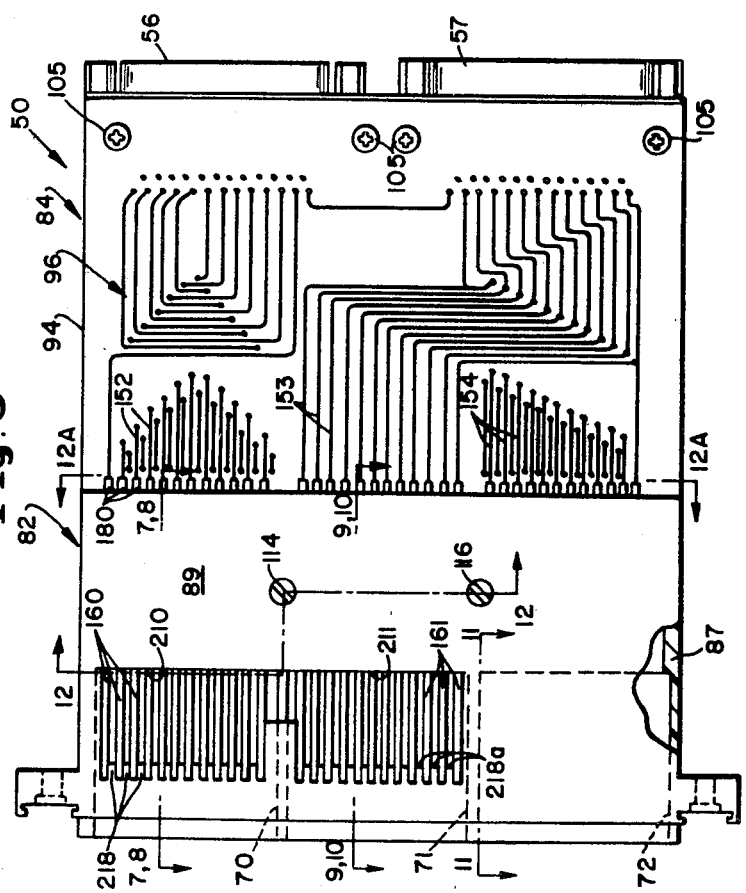

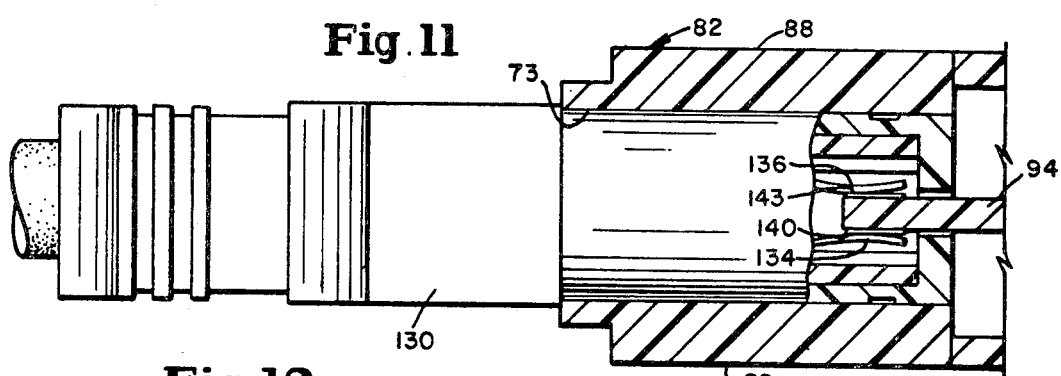
Fig. 11
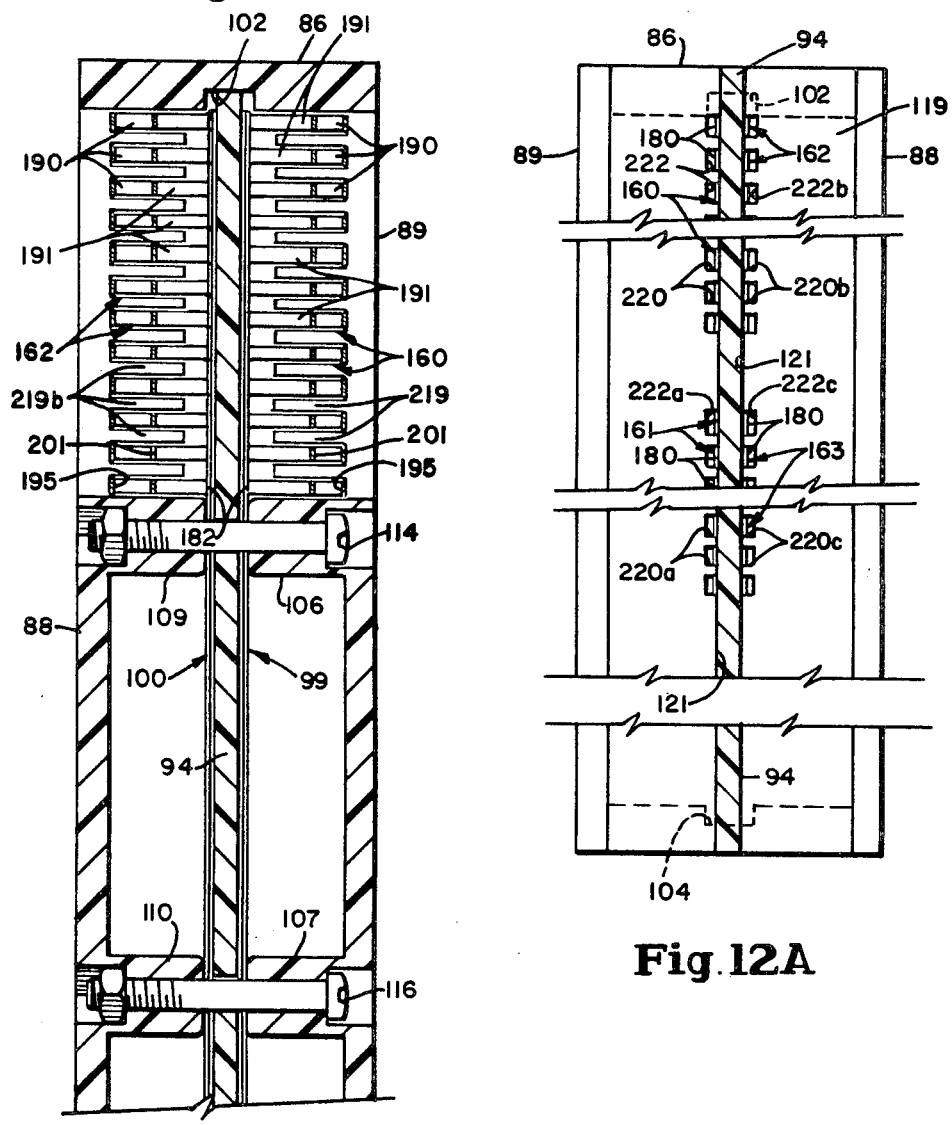
Fig. 12
Fig. 12A

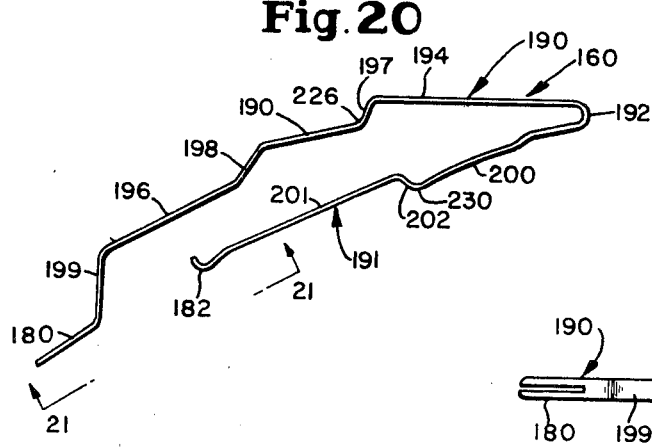

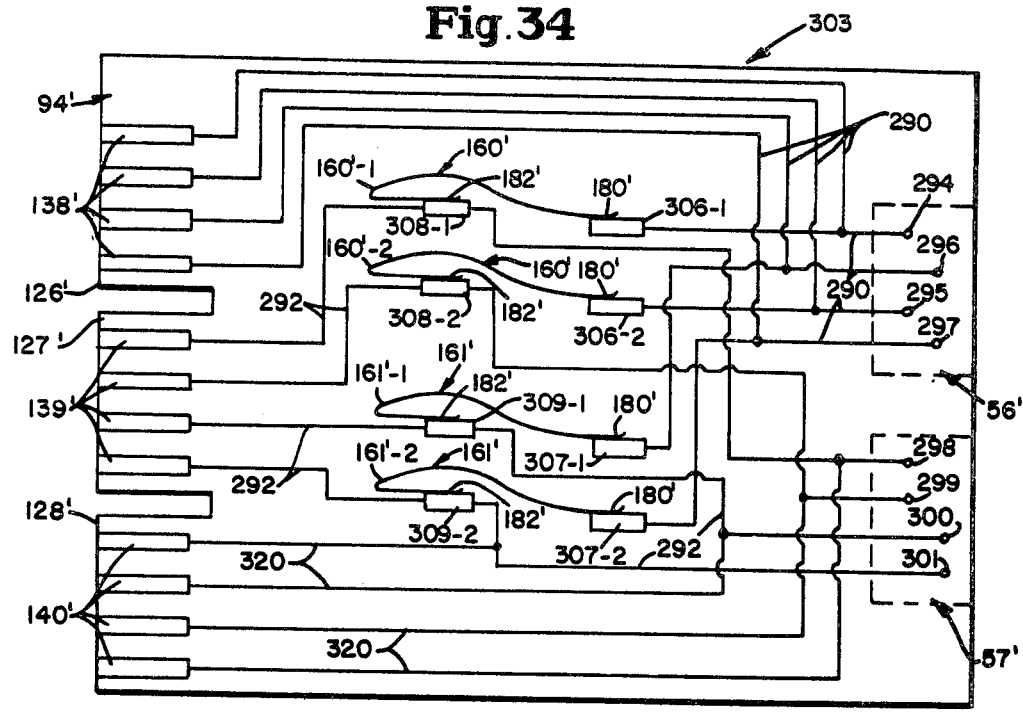
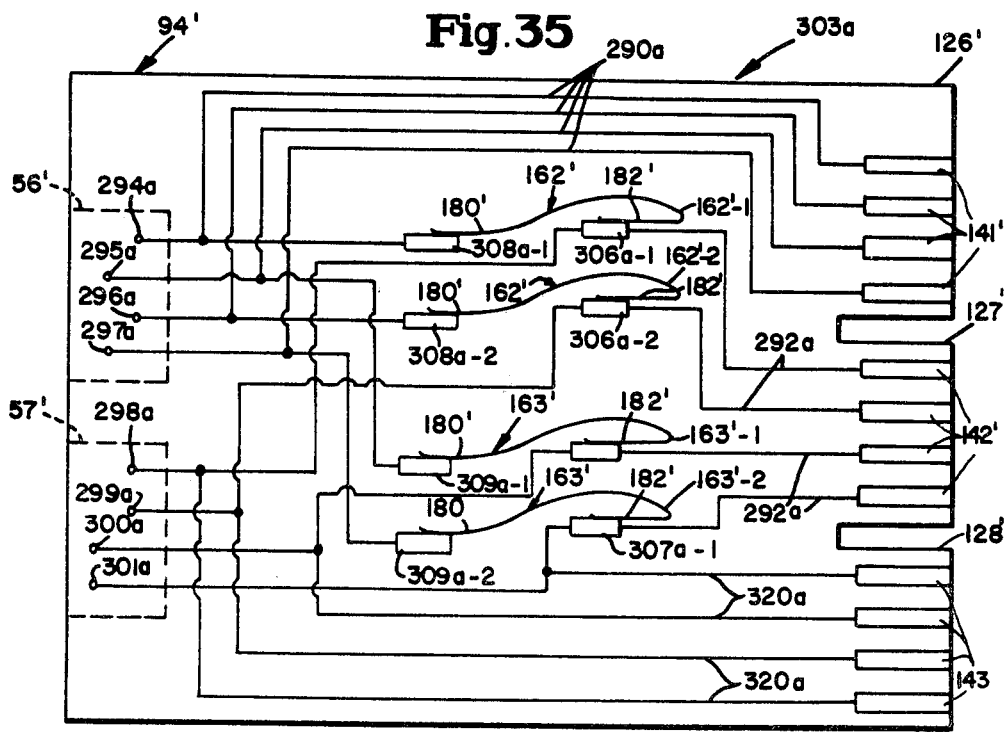

ELECTRICAL JACK AND PATCH CORD ASSEMBLIES

RELATED APPLICATIONS

This is a division, of application Ser. No. 955,233 filed Oct. 27, 1978 now U.S. Pat. No. 4,256,936, issued Mar. 17, 1981, said application is a continuation-in-part of my copending application Ser. No. 650,019 filed on Jan. 18, 1976 for ELECTRICAL JACK AND PATCH CORD ASSEMBLY, now U.S. Pat. No. 4,140,918 issued Feb. 20, 1979 said application Ser. No. 650,019 being, in turn, a continuation-in-part of my now abandoned application Ser. No. 420,584 filed on Nov. 30, 1973.

FIELD OF INVENTION

This invention relates to electrical switch and connector equipment and is particularly concerned with electrical jacks and patch cord plug connectors.

BACKGROUND

Prior to this invention various self-normalling electrical jacks have been used for interconnecting multi-terminal electrical circuits such as data communication equipment and computers or other signal producing and utilization equipment. In manufacturing jacks of this type it has been a general practice to use discrete wiring or conductor components with plug actuatable contacts to complete the various current conducting paths through the jack. Such electrical jack constructions are described in U.S. Pat. No. 3,692,966 (issued on Sept. 19, 1972) and in my previously identified copending application Ser. No. 650,019.

In place of the discrete conductor components it has been proposed to use board-mounted printed circuits. These proposals, however, have led to large, bulky, expensive jack constructions having numerous parts. The present invention has none of these drawbacks and offers additional advantages and improvements as will become apparent from the following summary and detailed description.

SUMMARY AND OBJECTS OF INVENTION

The plural socket jack embodying the principles of this invention mainly comprises a printed circuit board or card and a multiplicity or a selected number of circuit-making contact springs. The contact springs contact and coact with printed circuit conductors or elements on the printed circuit board to establish a multiplicity of mutually insulated normal through circuits or current conducting paths each terminating at opposite ends in first and second terminals. The terminals of the normal through circuits are adapted to be connected to electrical equipment or electrical circuits located exteriorly of the jack. The contact springs are actuatable by reception of a patch cord plug in the jack to open or break the normal through circuits, thereby electrically disconnecting the first terminals of the normal through circuits from the second terminals of the normal through circuits.

The normal through circuits may advantageously terminate at their opposite ends in a pair of multi-terminal connectors. These multi-terminal connectors may, if desired, be mounted directly on the printed circuit board mentioned above.

The printed circuit board extends into and is detachably secured to a one-piece hollow jack housing or body. The jack housing defines the jack's plug-receiving sockets and is designed so that it can conveniently and economically be molded as one-piece from any suitable electrical insulating material.

According to this invention the arrangement and construction of the printed circuitry and contact springs in the jack assembly are such that the only discrete electrically conductive components in the entire jack assembly are the contact springs themselves and the terminal connections for the multi-terminal connectors mentioned above. According to another important feature of this invention the contact springs are trapped and held in place by cooperating surfaces on the one-piece molded jack housing and the printed circuit board without being affixed to any part of the jack.

Because of the foregoing jack construction the only fasteners required in the entire jack assembly of this invention are those needed for securing the printed circuit board to the jack housing and those needed for mounting the previously mentioned multi-terminal connectors on the printed circuit board in the embodiments where the connectors are supported on the printed circuit board itself. In the illustrated embodiments the printed circuit board is rigidly fixed to the jack housing by only two suitable fasteners such as a pair of screw and nut assemblies.

According to still another feature of this invention the novel construction and arrangement of the jack housing and contact springs permit easy installation of the contact springs. Furthermore, the contact springs can be removed and replaced without removing any other part of the jack and also without loosening or removing any fasteners or unsoldering any connections in the jack assembly.

The foregoing jack construction also simplifies the assembly of the component jack parts. In particular, assembly is accomplished by first inserting the printed circuit board into the one-piece housing and securing the housing and printed circuit board together with the fasteners mentioned above. Thereafter, the contact springs are assembled simply by inserting them through one or more windows or apertures in the jack housing and by positioning them in their operative positions.

In the first illustrated embodiment the contact springs are divided into two independently operated sets. One set of the contact springs is directly engaged and deflected by the body of a patch cord plug upon insertion of the plug into one of the jack's plug-receiving sockets to electrically disconnect the terminals of one of the multi-terminal connectors from the terminals of the other of the multi-terminal connectors. The other set of contact springs is directly engaged and deflected by the body of the patch cord plug upon insertion of the patch cord plug into a second plug-receiving socket in the jack to also electrically disconnect the multi-terminal connectors from each other. This particular construction eliminates the need for separate plug-operated mechanisms of the type that transmits motion to actuate the contacts in the jack.

In the second illustrated jack embodiment of this invention, a flap engages the contact springs and extends into the two plug-receiving jack sockets mentioned above in a position where it, in turn, is engaged and pivoted by insertion of a patch cord plug into either one of the two sockets. The pivotal motion of the flap deflects the contact springs to their circuit-breaking positions. This simple flap construction simplifies the printed circuit package and reduces the number of required contact springs as compared with the first illustrated embodiment.

According to another feature of this invention each of the jack's contact springs is permanently bent back towards itself to define two spring arms which act independently of each other. One of the spring arms is biased by engagement with a jack housing surface to stationarily seat against a contact pad in the printed circuitry. The other spring arm is arranged for deflection between circuit-opening and circuit-closing positions and is normally biased to its circuit-closing position where its free end seats against another printed circuit contact pad. The deflectible spring arm is arranged and flexed in such a manner to wipe its associated contact pad as it is lifted off the contact pad and also as it touches down on the contact pad. Wiping the contact pad in this manner assures good low resistance electrical contact between the deflectible spring contact arm and the contact pad.

According to still another feature of this invention coacting means are provided on the body of the patch cord plug and the deflectible contact spring arm mentioned above for releaseably locking or latching the patch cord plug in an operative position in the electrical jack. This unique latching construction eliminates the need for separate mechanisms of the type used to releaseably retain the patch cord plug in its operative, plugged-in position in the jack.

According to still another feature of this invention the patch cord plug body is provided with a novel strain relief cable-anchoring construction which resists tensioning or turning of the patch cord's cable.

With the foregoing in mind, it is the general aim and purpose of this invention to provide a novel electrical jack which is relatively inexpensive to manufacture. Another important object of this invention is to provide a novel electrical jack which is compactly and efficiently organized, which has relatively few parts and which is easy to assemble.

Still another object of this invention is to provide a novel electrical jack which does not require any fasteners, soldering connections or the like to retain circuit-making contact springs in place within the jack body.

A further object of this invention is to provide a novel electrical jack construction in which all of the electrically conductive components form a part of a printed circuit except for the contact spring elements themselves and terminal connections to electrical connectors.

Still another object of this invention is to provide a novel electrical jack construction which permits easy installation and removal of the jack's contact springs.

A further object of this invention is to provide a novel electrical jack construction in which the circuit-making contact spring elements are directly engaged for deflection by the body of a patch cord plug upon insertion of the patch cord plug into the jack.

Still another object of this invention is to provide a novel electrical jack construction in which a pivoted flap is engaged by the body of a patch cord plug upon insertion of the plug into the jack to deflect to contact springs to their circuit-opening positions.

A further object of this invention is to provide a novel electrical jack in which the deflectible contact spring portions are biased and flexed in such a way to wipe their associated stationary contact pads upon lifting off of the pad and also upon touching down on the pad.

Still another object of this invention is to provide a novel electrical jack and patch cord plug assembly in which coacting means of the jack's contact springs and the plug's insulating body releaseably lock the plug in its operating position in the jack.

A further object of this invention is to provide a patch cord plug with a novel patch cord cable strain relief construction.

Further objects of this invention will appear as the description proceeds in connection with the appended claims and below-described drawings.

DESCRIPTION OF DRAWINGS

FIG. 2 is a front elevation of the electrical jack shown in FIG. 1A;

FIG. 3 is a left hand side elevation of the electrical jack shown in FIG. 2;

FIG. 4 is a right hand side elevation of the electrical jack shown in FIG. 2;

FIG. 5 is a rear elevation of the electrical jack shown in FIG. 2;

FIG. 6 is a top plan view of the electrical jack shown in FIG. 2;

FIG. 11 is a section taken substantially along lines 11—11 and illustrates the patch cord plug inserted into the lowermost one of the jack's plug-receiving sockets;

FIGS. 12 and 12A are sections respectively taken along lines 12—12 and lines 12A—12A of FIG. 3;

FIG. 15 is a front end elevation of the patch cord plug shown in FIGS. 8, 10 and 11;

FIG. 16 is a side elevation of the patch cord plug shown in FIG. 15;

FIG. 17 is a top plan view of the patch cord plug shown in FIG. 15;

FIG. 18 is a section taken substantialy along lines 18—18 of FIG. 16;

FIGS. 19 and 19A are interior elevations of the complementary plug body halves shown in FIG. 15;

FIG. 20 is a side elevation showing the profile of one of the contact springs illustrated in FIG. 3;

FIG. 21 is a fragmentary view of the contact spring as seen from lines 21—21 of FIG. 20;

FIGS. 34 and 35 illustrate a schematic circuit diagram of the circuit for the jack construction shown in FIGS. 22-33.

DETAILED DESCRIPTION

Figure 1:
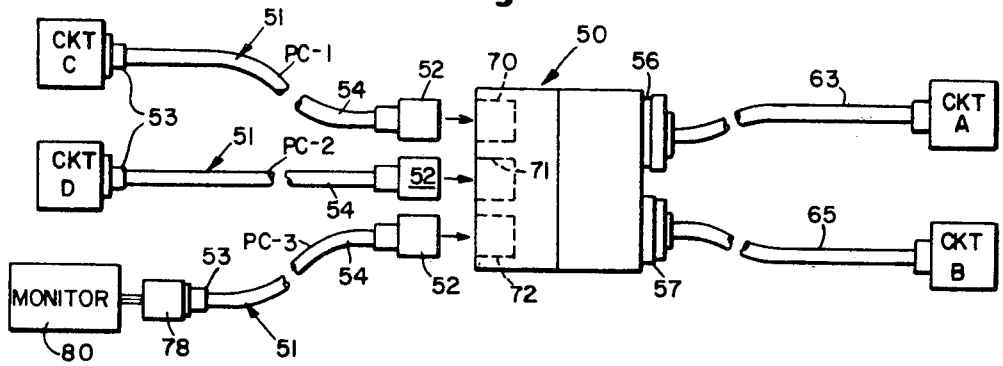
FIG. 1 is a generally schematic diagram showing the electrical jack of this invention and the patch field and monitoring connections that it is capable of making.

Referring to the drawings, one embodiment of an electrical jack assembly embodying various principles of this invention is generally indicated at 50 in FIGS. 1-6 and is adapted for use with one or more patch cords for making selected patch field connections. One suitable construction of a patch cord is indicated at 51 in FIG. 1 and is shown to generally comprise a pair of patch cord plugs or plug connectors 52 or 53 which are interconnected by a multiple conductor cable 54.

As shown in FIG. 1, jack assembly 50 is advantageously provided with two multi-terminal connectors 56 and 57 to provide connections to exterior circuits or electrical equipment. Each of these connectors is provided with a multiplicity of mutually insulated terminal pins or elements and may advantageously be of the standard EIA (Electronic Industries Association) type. It will be appreciated that any suitable terminal construction, design or arrangement may be used in place of connectors 56 and 57.

In the use of jack assembly 50, connector 56 is adapted to be connected by a suitable connector and cable assembly 63 to a selected electrical circuit A such as a computer and connector 57 is adapted to be connected by another cable and connector assembly 65 to some other electrical circuit B such as a data communication terminal or modem.

Figure 1A:
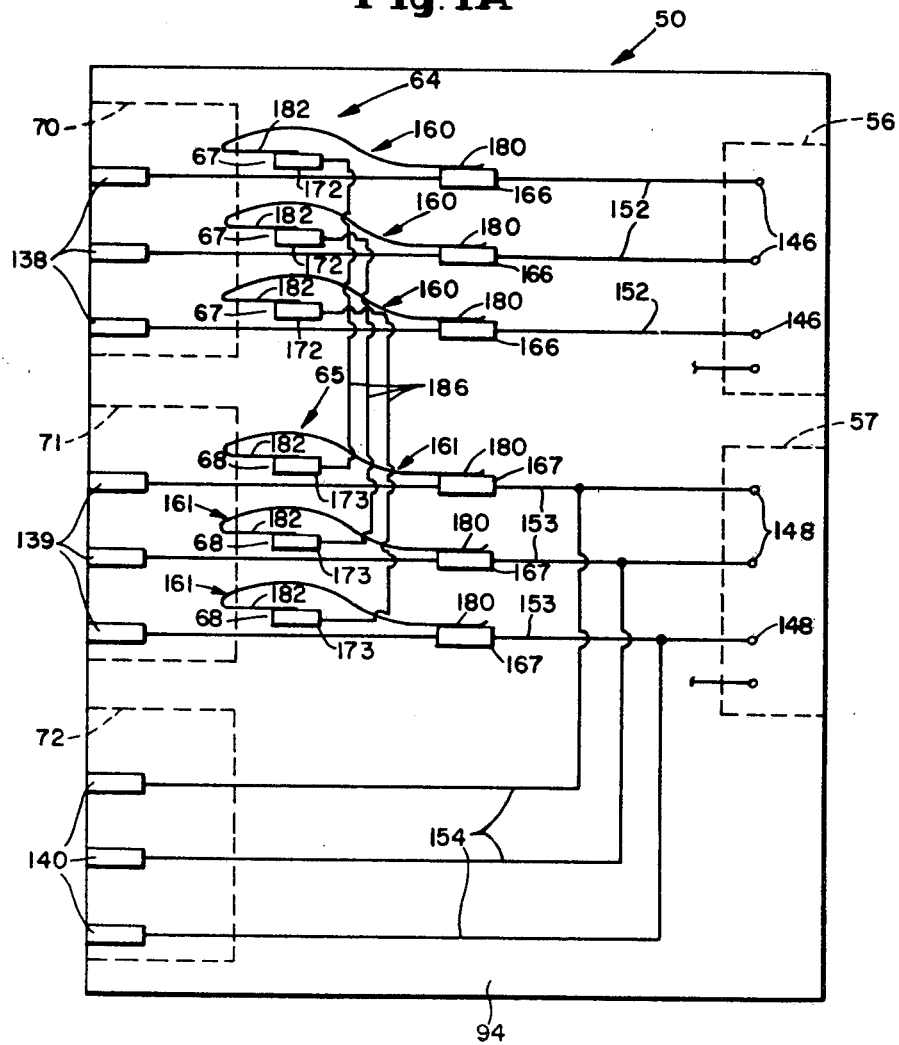
FIGS. 1A and 1B are generally schematic diagrams of the circuitry incorporated into one embodiment of the jack of this invention.

Referring to FIG. 1A, jack 50 is provided with a multiplicity of mutually insulated circuits or current conducting paths. These mutually insulated circuits terminate at opposte ends in the terminals of connectors 56 and 57 and have normally closed, selectively actutable switching or contact means for electrically connecting the terminals of connector 56 to the terminals of connector 57. In this embodiment the switching or contact means in the jack assembly comprises two sets of contact springs, one set being indicated at 64 and the other set being indicated at 66.

The contact springs in set 64 cooperate with stationary contacts or elements (to be described later) to establish a first group or array of normally closed sets of contacts 67. Similarly, the contact springs in set 66 cooperate with stationary contacts or contact elements (to be described later) to establish a second group or array of normally closed sets of contacts 68. By this arrangement each terminal of connector 56 is normally connected by way of two serially connected sets of normally closed contacts to a different one of the terminals in connector 57 to establish the current conducting paths between circuits A and B. Only three of these current conducting paths are shown in FIG. 1A to simplify the schematic diagram of the jack's internal circuitry.

Jack 50 is provided with three plug-receiving sockets 70, 71 and 72, the first two of which are used for patch field switching connections, and the third of which is used for a non-switching monitoring connection similar to the embodiments described in my previously identified application Ser. No. 650,019. The separate mutually insulated circuits or circuit connections established between connectors 56 and 57 are considered to be normal through or self-normalling circuits in the sense that contacts 67 and 68 are normally closed to complete or establish the circuit connections between the terminals of connectors 56 and 57 when no patch cord plug is received in or patched into either one of both of the plug-receiving sockets 70 and 71. Thus, circuits A and B will be electrically connected by these circuit connections when no patch cord plug is plugged into either one of the sockets 70 and 71.

The contact springs in set 64 are actuated by reception of a patch cord plug in socket 70 to open contacts 67. In a similar fashion the contact springs in set 66 are actuated by reception of a patch cord plug in socket 71 to open contacts 68. Accordingly, patching a patch cord plug into either one or both of the plug-receiving sockets 70 or 71 will open the normal through circuits between connectors 56 and 57, thereby electrically disconnecting connectors 56 and 57 from each other and hence electrically disconnecting circuits A and B from each other.

Similar to the construction described in my previously identified application Ser. No. 650,019, up to three of the patch cords 51 may be used with jack 50 to selectively establish various patch field connections. One example of the use of three patch cords is shown in FIG. 1 where the patch cords are respectively indicated at PC-1, PC-2 and PC-3. In this example patch cord PC-1 is shown to be plugged into a circuit C, and patch cord PC-2 is shown to be plugged into a circuit D.

Plugging the free plug of patch cord PC-1 into socket 70 electrically disconnects circuit A from circuit B and completes circuit connections for electrically connecting circuit C to circuit A. Plugging the free plug on patch cord PC-2 into socket 71 electrically disconnects circuit B from circuit A and completes the circuit connections for electrically connecting circuit D to circuit B.

Patching into the monitoring position socket 72 provides monitoring or trunking connections for picking up the signals or prevailing currents or voltages at the terminals of connector 57 without opening the normal through circuits and also without altering any patch field circuit connections that may be established by patching into either one or both of the sockets 70 and 71. Such a monitoring or trunking circuit connection is established by plugging one of the plugs of patch cord PC-3 into socket 72 and by plugging the other plug of patch cord PC-3 into a jack or receptacle 78 which is electrically connected to appropriate monitoring or signal utilization equipment as indicated at 80 in FIG. 1. The monitoring equipment may comprise a current meter, a voltage meter, or an oscilloscope.

In addition to connectors 56 and 57 and the contact springs sets 64 and 66, the jack assembly shown in FIGS. 2-6 mainly comprises a hollow housing or body 82 and a printed circuit package 84. Housing 82 is molded in onepiece from any suitable electrical insulating material and is rectangular in configuration. As shown, housing 82 is open at both ends and is formed with parallel spaced apart top and bottom walls 86 and 87 and parallel spaced apart side walls 88 and 89 extending between top and bottom walls 86 and 87. The housing openings at the front and back ends are rectangular and aligned.

As shown in FIG. 2, housing 82 is formed with a pair of internal, parallel spaced apart partitioning walls 90 and 91 extending inwardly from the front edge or face of the housing and spanning the space within housing 82 between side walls 88 and 89. Partition walls 90 and 91 are integrally joined to side walls 88 and 89 at right angles thereto and lie parallel with the housing's top and bottom walls 86 and 87. Walls 90 and 91 divide the open front end of housing 82 into three equally dimensioned segments to define or form the plug-receiving sockets 70-72 in jack assembly 50.

More specifically, socket 70 is formed and delimited by top wall 86, partition wall 90 and the portions of side walls 88 and 89 extending between walls 86 and 90, socket 71 is formed and delimited by partition walls 90 and 91 and the portions of side walls 88 and 89 extending between the partition walls 90 and 91, and socket 72 is formed and delimited by partition wall 91 and bottom wall 87 and the housing's side wall portions extending between walls 91 and 87. By this construction it will be appreciated that sockets 70-72 open at the front end of housing 82, are equally dimensioned, are coextensive and open at their rearward ends into the hollow interior of housing 82.

Sockets 70-72 lie in a straight row between the housing's top and bottom walls and are each constructed to accept or slidably receive the same type of patch cord plug. In this embodiment it will be noted that sockets 70-72 are rectangular in configuration rather than being round as is the case with the electrical jacks described in my previously identified application Ser. No. 650,019.

Referring to FIGS. 3, 4, 13 and 14, the printed circuit package 84 includes a printed circuit board 94 having a first printed circuit pattern 96 suitably formed or imposed on one side thereof and a second printed circuit pattern 98 suitably imposed on the opposite side thereof. In addition to the printed circuit board 94, the printed circuit package also includes a pair of rider board assemblies 99 and 100 mounted on opposite sides of the printed circuit board 94. Although both sides of the printed circuit board 94 are used in this embodiment for establishing the various circuit connections in the jack assembly it will be appreciated that the various principles of this invention may be utilized in an electrical jack construction in which only one side of the printed circuit board is used, and not the other.

The printed circuit board 94 may be formed from any suitably electrical insulating material and extends into the interior of housing 82 through the rearward open end of the housing to lie parallel to and midway between the housing side walls 88 and 89. The upper and lower edges of printed circuit board 94 are slideably received in opposed inwardly opening flat-bottomed guide channels or grooves 102 and 104. Grooves 102 and 104 are formed in the interior faces of the top and bottom walls 86 and 97, respectively.

As shown, board 94 projects rearwardly from housing 82 such that its rearward end is exterior of the housing. Connectors 56 and 57 are advantageously detachably mounted by screws 105 on the rearward end portion of board 94 exteriorly of housing 82.

To guide and confine the printed circuit board 94, housing 82 is integrally formed with interior stiffening ribs 106, 107, 108, 109, 110 and 111. Ribs 106-108 are integral with and extend inwardly from side wall 88 and ribs 109-111 are integral with and extend inwardly from side wall 89 in such a manner that ribs 109-111 align with ribs 106-108 respectively. The end faces of ribs 106-108 are spaced equidistantly apart from the opposing end faces of ribs 109-111. The printed circuit board 94 is slideably received between the one set of ribs 106-108 and the other set of ribs 109-111 as shown.

Printed circuit board 94 is rigidly but detachably secured to housing 82 by just two fastener assemblies 114 and 116, each consisting of a screw and nut. The screw of fastener assembly 114 extends through a bore or hole 118 which is formed through side wall 88, ribs 106 and 109 and side wall 89. The screw of fastener assembly 116 extends through another bore or hole 120 which is formed through side wall 88, ribs 107 and 110 and side wall 89. The axes of holes 118 and 120 are in parallel spaced apart relation and extend normal to side walls 88 and 89.

The side walls 88 and 89 of housing 82 are sufficiently flexible to deflect slightly when the nuts of fastener assemblies 114 and 116 are tightened to securely clamp the printed circuit board 94 in place in housing 82 between the two opposing sets of ribs in the housing. Fastener assemblies 114 and 116 are the only mechanical fasteners that are used in the complete jack assembly apart from those that are employed to detachably mount connectors 56 and 57 on the printed circuit board. This construction simplifies and reduces the expense of assembling the component parts of jack assembly 50.

Figure 7:
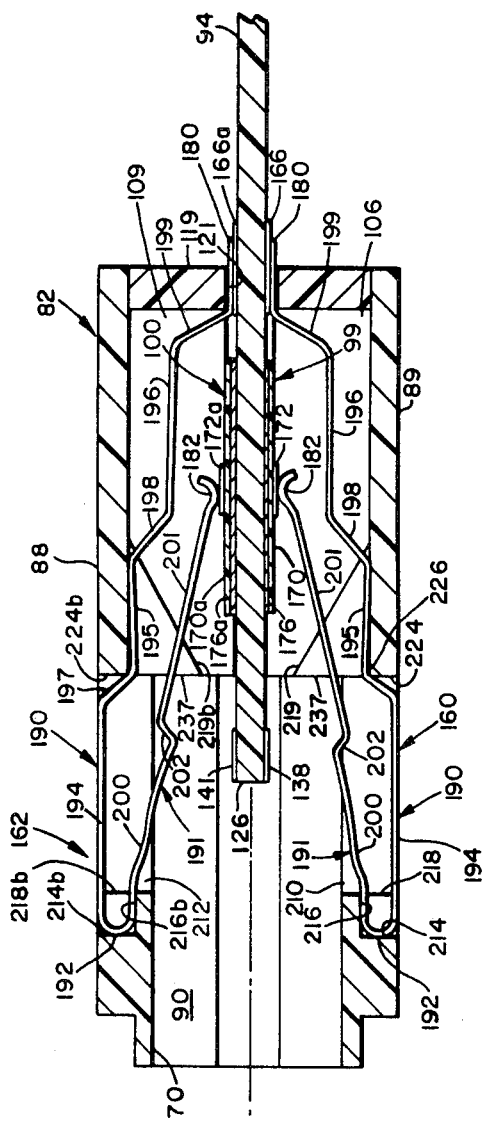
FIG. 7 is a section taken substantially along lines 7—7 of FIG. 3.
Figure 9:
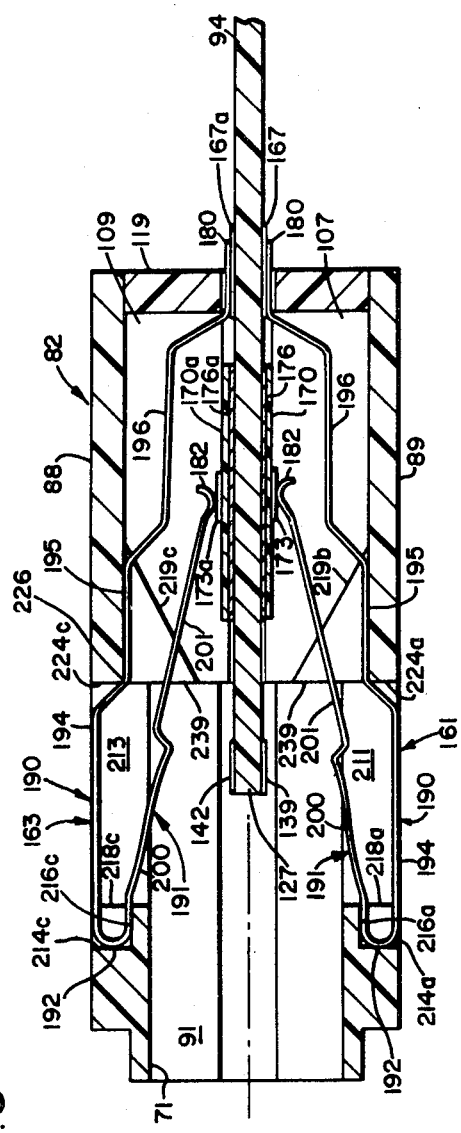
FIG. 9 is a section taken substantially along lines 9—9 of FIG. 3.

As shown in FIGS. 5, 7 and 9, jack assembly 50 may be provided with a back cover plate 119 for housing 82. Plate 119 is molded from any suitable electrical insulating material and is snugly received with a tight fit between side walls 88 and 89 to seat against the rearward edges of walls 86 and 87. Plate 118 closes or covers the open rear end of housing 82 and is formed with a longitudinal slot 121 through which the printed circuit board 94 extends. Preferably, plate 119 is fixed to the rearward end of housing 82 by adhesive or bonding. By this construction plate 119 is mounted in place on housing 82 without the use of mechanical fasteners of any kind.

Figure 14:
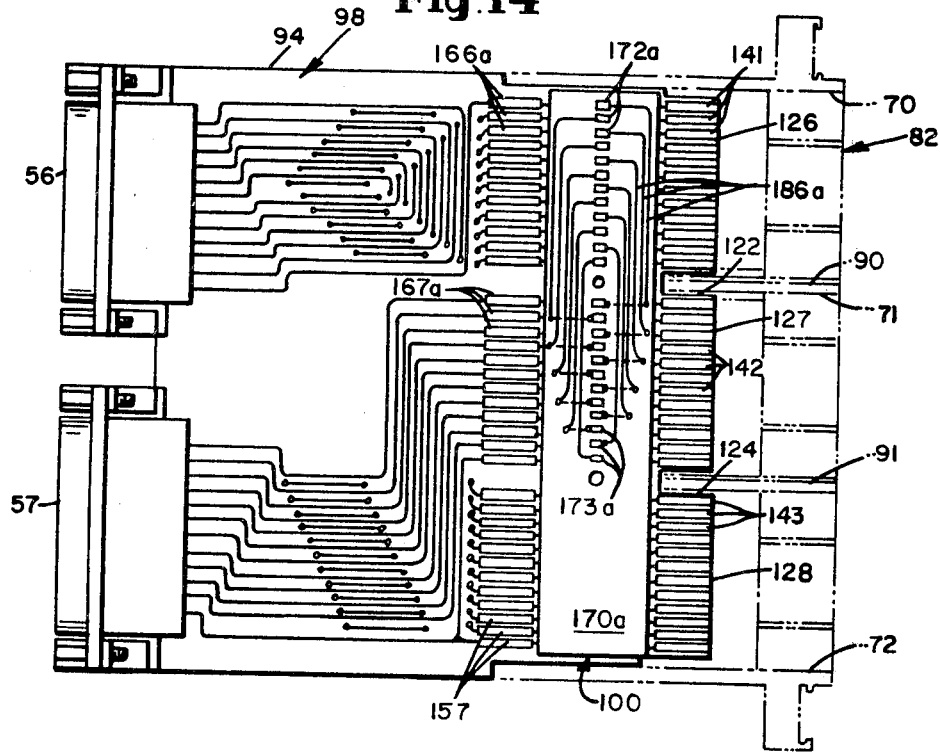
FIG. 14 is a right hand side elevation of the printed circuit board shown in FIGS. 2-6.
Figure 13:
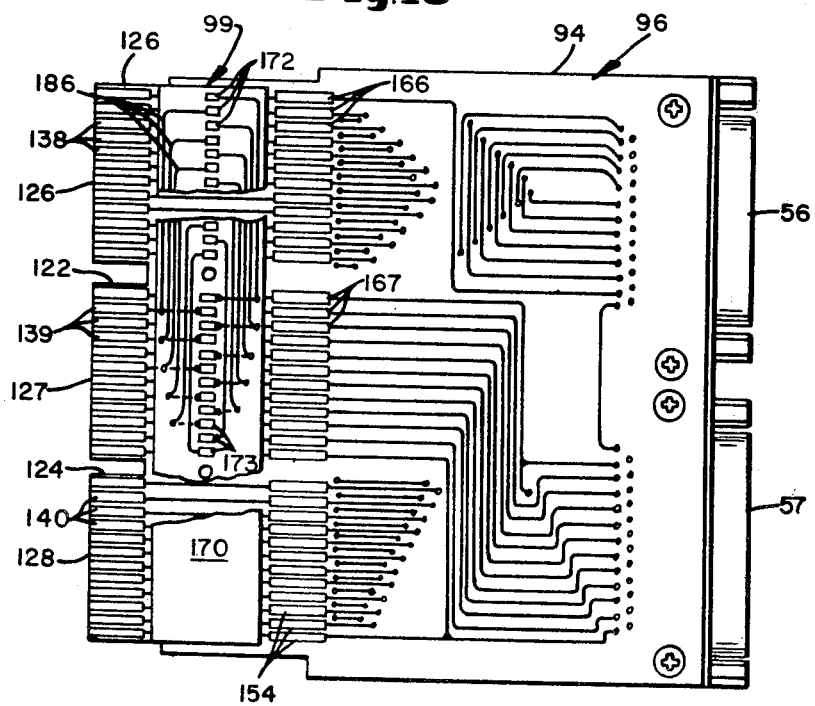
FIG. 13 is a left hand side elevation of the printed circuit board shown in FIGS. 2-6.

As shown in FIGS. 13 and 14, the forward edge of printed circuit board 94 in housing 82 is notched to form two forwardly opening slots 122 and 124 for receiving the rearward end portions of partition walls 90 and 91, respectively. Slots 122 and 124 divide the forward edge portion of printed circuit board 94 into three forwardly extending segments 126, 127 and 128. Segments 126-128 project forwardly into sockets 70-72, respectively, and lie in a common plane that medially intersects housing 82 and sockets 70-72 in parallel relation to the housing side walls 88 and 89.

Patch cord plugs 52 or 53 are of the same construction as shown in FIGS. 15-17. Each of these plugs is of the edge connector type having a hollow insulating body 130, a first set of contact spring elements 134, and a second set of contact spring elements 136. As shown, body 130 is formed with an open, rectangular circuit board-receiving end 137. Contact elements 134 and 136 are mounted in body 132 and are arranged in two parallel spaced apart rows to define an outwardly opening mouth for receiving any one of the printed circuit board segments 126-128 depending upon which one of the jack assembly sockets the plug is plugged into. It will be appreciated that the plug and electrical jack construction is such that either one of the plugs 52 or 53 is pluggable into any selected one of the jack sockets 70-72.

In each patch cord plug, the contact elements are mutually insulated from each other. The contact elements in plug 52 are individually connected by separate conductors in cable 54 to corresponding contact elements in plug 53, whereby separate mutually insulated current conducting paths are established between the corresponding contact elements in the two plugs.

Figure 1B:
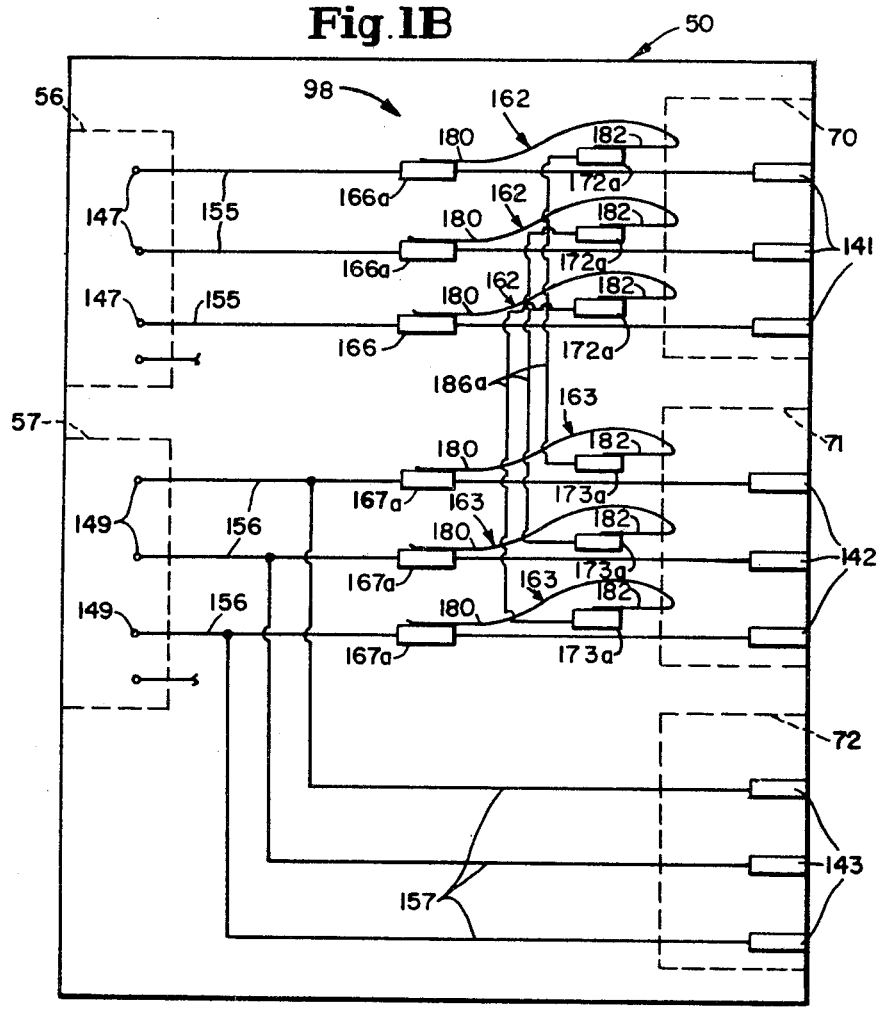

To make circuit contact with the contact spring elements 134 in either one of the patch cord plugs 52 or 53, the printed circuit pattern 96 on one side of the printed circuit board 94 includes finger stock (see FIG. 13) comprising a first set of contact fingers 138, a second set of contact fingers 139, and a third set of contact fingers 140. Fingers 138-140 are coextensively arranged in parallel spaced apart relation in a straight row and extend rearwardly from the forward edge of printed circuit board 94. As shown, fingers 138 are formed on the printed circuit board segment 126, fingers 139 are formed on the printed circuit board segment 127, and fingers 140 are formed on the printed circuit board segment 128.

Where it is desired to utilize both sides of the printed circuit board 94 and all of the contact spring elements in each of the patch cord plugs, the printed circuit pattern 98 on the right hand side of printed circuit board 94 also includes finger stock corresponding to the finger stock just described for the left hand side of printed circuit board 94. More specifically, the printed circuit finger stock on the right hand side of printed circuit board 94 comprises a first set of contact fingers 141 corresponding to fingers 138, a second set of contact fingers 142 corresponding to fingers 139 and a third set of contact fingers 143 corresponding to fingers 140 as shown in FIGS. 1B and 14.

Fingers 141-143 are coextensively arranged in a straight row and extend rearwardly from the forward edge of printed circuit board 94. Similar to the arrangement of fingers 138-140, fingers 141 are disposed on the printed circuit board segment 126, fingers 142 are disposed on the printed circuit board segment 127 and fingers 143 are disposed on the printed circuit board segment 128.

In utilizing both sides of the printed circuit board 94 the terminals in connector 56 may be divided into a first set indicated at 146 and a second set indicated at 147. Similarly, the terminals in connector 57 may be divided into a first set indicated at 148 and a second set indicated at 149.

Each of the fingers 138 is connected by a separate printed circuit conductor or track 152 (FIG. 1A) to a different one of the connector terminals 146, and each of the fingers 141 on the opposite side of the printed circuit board is connected by a separate printed circuit conductor or track 155 (FIG. 1B) to a different one of the connector terminals 147. In a similar fashion each of the fingers 139 is connected by a separate printed circuit conductor or track 153 (FIG. 1A) to a different one of the connector terminals 148, and each of the fingers 142 is connected by a separate printed circuit conductor or track 156 (FIG. 1B) to a different one of the connector terminals 149.

In this embodiment each of the fingers 140 is connected by a separate printed circuit conductor or track 154 (FIG. 1A) to a different one of the connector terminals 148, and each of the fingers 143 is connected by a separate printed circuit conductor or track 157 (FIG. 1B) to a different one of the connector terminals 149.

To establish the current conducting paths between fingers 140 and conductor terminals 148 with minimal use of printed circuit conductors, each of the printed circuit conductors 154 may be joined to a different one of the printed circuit conductors 153. Likewise each of the printed circuit conductors 157 may be joined to some point on a different one of the printed circuit conductors 156 (FIG. 1B) to reduce the extent of printed circuit tracks in the patterns on the printed circuit board.

Depending upon the printed circuit conductor pattern used, each of the printed circuit conductors 152-157 may be divided into different segments, some extending on one side of board 94 and others extending on the other side of board 94 to avoid interference between the various conductors in the printed circuitry.

It will be appreciated that any suitable pattern or arrangement of the printed circuit conductors 152-157 may be utilized in conjunction with the principles of this invention, the one shown in the drawings being merely illustrative.

Figure 8:
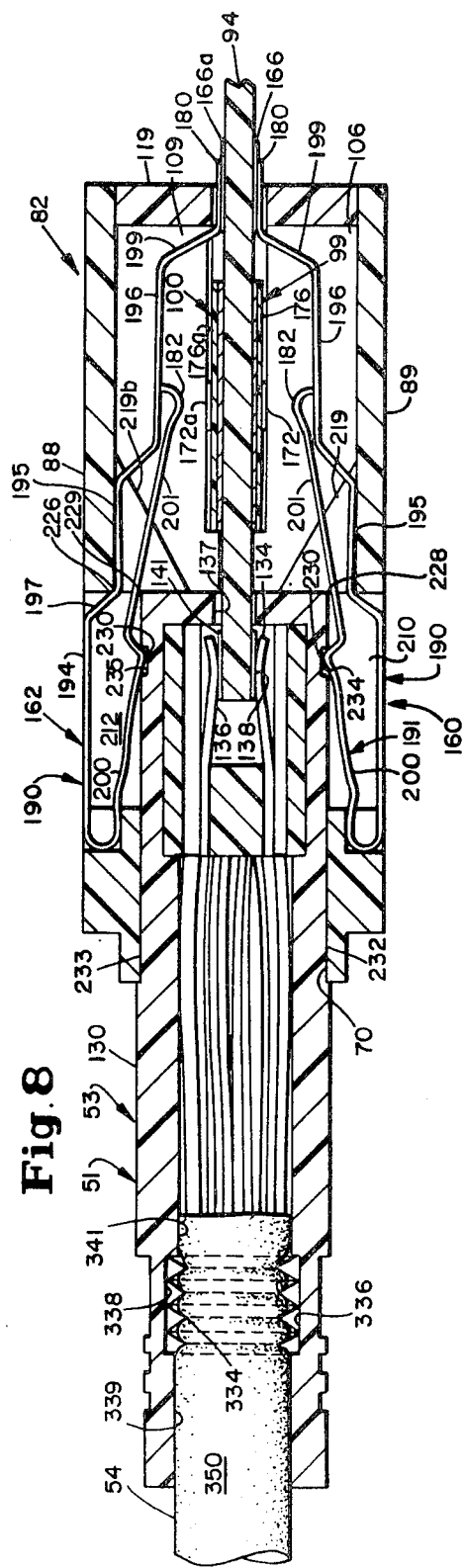
FIG. 8 is a section similar to FIG. 7, but showing one of the patch cord plugs inserted into uppermost one of the sockets in the jack assembly.

From the foregoing description it will be appreciated that insertion of either one of patch cord plugs 52 or 53 into socket 70 in the manner shown in FIG. 8 results in the electrical contact of each of the plug's contact elements 134 with a different one of the fingers 138 to thereby provide for the electrical connection of each of the contact elements 134 to a different one of the connector terminals 146. Insertion of either of the plugs 52 or 53 into socket 70 also results in the electrical contact of each of the plug's contact elements 136 with a different one of the fingers 141, thereby electrically connecting each of the contact elements 136 to a different one of the connector terminals 147.

Figure 10:
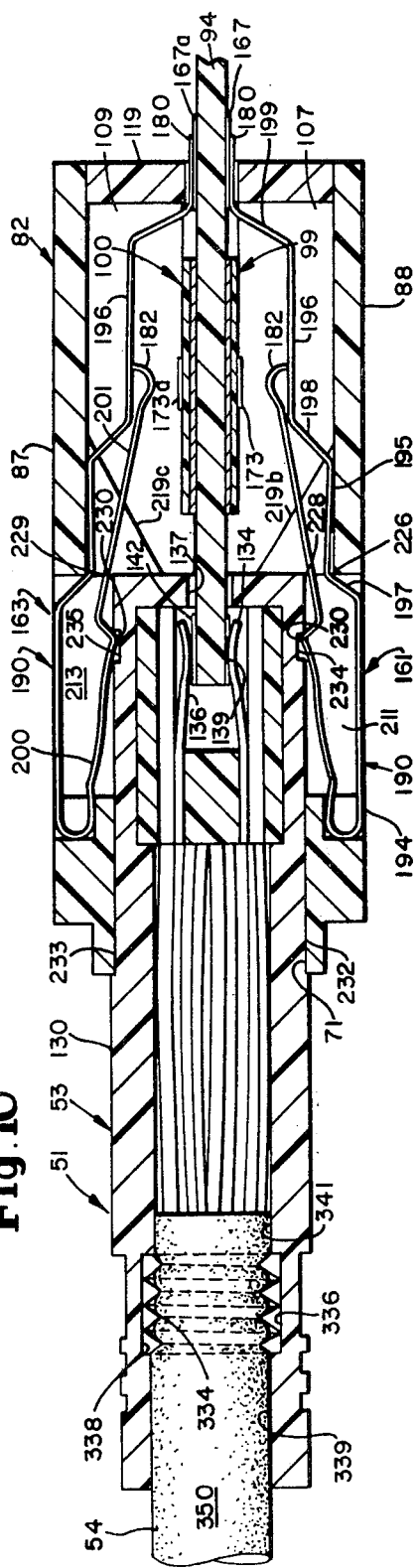
FIG. 10 is a section similar to FIG. 9, but showing one of the patch cord plugs inserted into the intermediate or middle plug-receiving socket of the jack assembly.

Insertion of either of the patch cord plugs 52 or 53 into socket 71 in the manner shown in FIG. 10 similarly results in the electrical contact of each of the plug contact elements 134 with a different one of the fingers 139 to thereby electrically connect each of the plug's contact elements 134 to a different one of the contact terminals 148. Insertion of either one of the plugs 52 or 53 into socket 71 also results in the electrical contact of each of the plug's contact elements 136 with a different one of the fingers 142, thereby electrically connecting each of the contact elements 136 to a different one of the connector terminals 149.

Insertion of either one of the plugs 52 or 53 into socket 72 in the manner shown in FIG. 11 results in the electrical contact of each of the plug's contact elements 134 with a different one of the fingers 140 and also each of the plug's contact elements 136 with a different one of the fingers 143. As a result, each of the plug's contact elements 134 will be electrically connected to a different one of the connector terminals 148 and each of the plug's contact elements 136 will be electrically connected to a different one of the connector terminals 149.

In this embodiment the contact spring set 64 includes a first group of contact springs 160 and a second group of contact springs 162. As shown in FIGS. 7 and 8 these two groups of contact springs are disposed on opposite sides of the printed circuit board 94 for operation with socket 70. In a similar manner the contact spring set 66 includes a first group of contact springs 161 and a second group of contact springs 163 respectively disposed on opposite sides of printed circuit board 94 for operation with socket 71.

On one side of the printed circuit board 94 the printed circuit pattern is formed with a first set or group of contact pads or strips 166 for contact springs 160 and a second set or group of contact pads or strips 167 for contact springs 161. In addition to contact pads 166 and 167, contact pads are formed on a printed circuit rider board 170 which forms a part of the rider board assembly 99. More specifically, the printed circuit on rider board 170 includes a first set or group of contact pads 172 for contact springs 160 and a second set or group of contact pads 173 for contact springs 161.

In addition to board 170, the rider board assembly 99 also includes an insulating board 176. Insulating board 176 is bonded or otherwise rigidly attached on one side to printed circuit board 94. Board 170 is bonded to or otherwise rigidly attached to the other side of insulating board 176 such that insulating board 176 lies between the main printed circuit board 94 and rider board 170 to electrically insulate the printed circuit pattern on rider board 170 from the printed circuitry that is applied directly to the printed circuit board 94.

The printed circuit pads 166 and 167 are in parallel spaced apart relationship and are arranged in a straight row along an intermediate portion of board 94 between the row of fingers 138 and 139 and the terminals for connectors 56 and 57. Rider board assembly 99 is disposed between the row of contact pads 166 and 167 and the row of fingers 138 and 139. Contact pads 172 and 173 are disposed in parallel spaced apart relation and are arranged in a straight row which lies between the row of fingers 138 and 139 and the row of contact pads 166 and 167.

As shown in FIG. 1A and FIG. 13, each of the contact pads 166 forms a part of a different one of the printed circuit conductors 152, and each of the contact pads 167 forms a part of a different one of the printed circuit conductors 153.

Each of the contact springs 160–163 has a tail 180 and a deflectible circuit breaking end 182. The tail 180 of each contact spring 160 stationarily seats against and makes electrical contact with a different one of the contact pads 166. Similarly, the tail 180 of each contact spring 161 stationarily seats against and makes electrical contact with a different one of the contact pads 167.

The deflectible circuit-breaking end 182 of each contact spring 160 is normally biased to seat against and make electrical contact with a different one of the contact pads 172 on rider board 170. The deflectible ends of springs 160 and contact pads 172 define the normally closed sets of contacts 67. Each contact spring 160 is therefore arranged and normally biased to contact a different one of the contact pads 166 and a different one of the contact pads 172 to establish a breakable circuit connection therebetween.

The deflectible end 182 of each contact spring 161 is normally biased to seat against and thus make electrical contact with a different one of the contact pads 173 on rider board 170 to thus define the normally closed sets of contacts 68. Each contact spring 161 is therefore arranged and normally biased to contact a different one of the contact pads 167 and a different one of the contact pads 173 to establish a breakable circuit connection therebetween.

The printed circuit pattern on rider board 170 also includes a multiplicity of printed circuit conductors or tracks 186. Each of the contact pads 172 is connected by a different one of the printed circuit conductors 186 to a different one of the contact pads 173. Contact springs 160 will be in electrical contact with contact pads 172 when no patch cord plug is inserted into socket 70, and contact springs 161 will be in electrical contact with contact pads 173 when no patch cord plug is inserted into socket 71.

From the foregoing description it will be appreciated that the circuit design including conductors 152, contact pads 166, contact springs 160, contact pads 172, the rider board printed circuit conductors 186, contact pads 173, contact springs 161, contact pads 167 and the printed circuit conductors 153 establishes a multiplicity of mutually insulated current conducting paths or circuits each having two serially connected sets of contacts 67 and 68. Each of the connector terminals 146 is connected by a different one of these current conducting circuits to a different one of the connector terminals 148. Furthermore, each of these current conducting circuits may be traced from one of the connector terminals 146 through one of the printed circuit conductors 152, through one of the contact pads 166, through one of the contact springs 160, through one of the contact pads 172, through one of the printed circuit conductors 186, through one of the contact pads 173, through one of the contact springs 161, through one of the contact pads 167, and through one of the printed circuit conductors 153 to one of the connector terminals 148.

The rider board assembly 100 on the right hand side of printed circuit board 94 is the same as rider assembly 99 on the opposite side of the printed circuit board. Accordingly, like reference numerals have been applied to designate like components of the two rider boards except that the reference numerals applied to the component parts of the rider board assembly 100 have been suffixed by the letter "a" to distinguish them from the reference numerals used for the component parts of rider board 99.

In addition to the rider board contact pads 172a and 173a the printed circuit pattern on the right hand side of printed circuit board 94 is formed with two sets of contact pads 166a and 167a as shown, for example, in FIG. 1B. Pads 166a and 167a correspond respectively to the pads 166 and 167. The arrangement of the contact pads 166a and 167a and fingers 141 and 142 along with the rider board contact pads 172a and 173a is the same as the arrangement described above for contact pads 166, 167, 172 and 173 and fingers 138 and 139. Additionally, the construction and arrangement of contact springs 162 and 163 correspond to that just described for contact springs 160 and 161 on the opposite side of the printed circuit board 94.

The tail of each contact spring 162 seats against and makes electrical contact with a different one of the contact pads 166a as best shown in FIGS. 7 and 9. Similarly, the tail of each of contact springs 163 seats against and makes electrical contact with a different one of the contact pads 167a.

The deflectible end of each of the contact springs 162 is normally biased to seat against and make electrical contact with a different one of the rider board contact pads 172a in such a manner that each pair of the engaging deflectible contact spring ends and rider board contact pads defines a set of normally closed contacts corresponding to contacts 67.

In a similar manner the deflectible end of each of the contact springs 163 is normally biased to seat against and make electrical contact with a different one of the rider board contact pads 173a in such a manner that each interengaging pair of the contact spring ends and rider board contact pads defines a set of normally closed contacts corresponding to the previously described normally closed contacts 68.

Similar to the circuit connections established by contact springs 160 and 161, contact springs 162 will be in electrical contact with contact pads 172a when no patch cord plug is inserted into socket 70, and contact springs 163 will be in electrical contact with contact pads 173a when no patch cord plug is inserted into socket 71. As shown, each of the contact pads 166a forms a part of a different one of the printed circuit tracks 155, and each of the contact pads 16 forms a part of a different one of the printed circuit tracks 156.

From the foregoing description it will be appreciated that the circuit design including conductors 155, contact pads 166a, contact springs 162, contact pads 172a, the rider board printed circuit conductors 186a, contact pads 173a, contact springs 163, contact pads 167a, and the printed circuit conductors 156 establishes a multiplicity of mutually insulated current conducting paths or circuits each having two sets of serially connected normally closed contacts. Each of the connector terminals 147 is connected by a different one of these current conducting circuits to a different one of the connector terminals 149.

As will be described in greater detail below springs 160 and 162 are arranged in housing 82 in such a way that they are engaged by either one of the patch cord plugs 52 or 53 upon insertion thereof into socket 70 to lift their deflectible ends 182 off the rider board contact pads 172 and 172a, thereby opening or breaking the normal through circuit connections between connectors 56 and 57 and thus electrically disconnecting the terminals of connector 56 from the terminals of connector 57. Insertion of the plug in socket 70 also establishes previously described circuit connections between the patch cord plug contact elements 134 and 136 and the terminals of connector 56 by way of the fingers stock and printed circuit conductors on the printed circuit board 94.

In a similar fashion contact springs 161 and 163 are arranged in such a way on housing 82 to be engaged by either one of the patch cord plugs 52 or 53 upon insertion thereof into socket 71 to lift the deflectible ends of springs 161 and 163 off their associated contact pads 173 and 173a, thereby opening or breaking the circuit connection between connectors 56 and 57 and thus electrically disconnecting the terminals of connectors 56 from the terminals of connectors 57. Insertion of plug in socket 71 additionally establishes the previously described electrical circuit connections between the patch cord plug's contact elements 134 and 136 and the terminals of connector 57 by way of the finger stock and printed circuit conductors on the printed circuit board 94.

As shown in FIGS. 7, 8 and 20, each of the contact springs 160 is of identical construction and may be formed from any suitable flat-sided spring metal material. Each of the springs 160 is bent back towards itself to form two separate spring arms or portions 190 and 191 which are integrally joined together by a curved intermediate nose portion 192. Spring arm 190 terminates in the free contact-engaging end 180, and spring arm 191 terminates in the other contact-engaging end 182. In the assembled relation of parts spring arm 191 lies between spring arm 190 and printed circuit board 94, and the free ends 180 and 182 are spaced apart as shown.

Spring arm 190 is somewhat longer than spring arm 191 to extend beyond the free end of arm 191. In FIG. 20, spring 160 is shown in its relaxed, undeflected, unflexed condition.

Still referring to FIG. 20, spring 160 is formed with three spaced apart straight segments 194, 195 and 196 and three sharply bent, crooked or offset portions 197, 198 and 199. The straight spring segment 194 extends between the intermediate spring portion 192 and offset portion 197. Offset portion 197 interconnects and provides an offsetting transition between the straight spring segments 194 and 195. The offset portion 198 interconnects and provides an offsetting transition between the straight spring segments 195 and 196, and offset portion 199 interconnects and provides an offsetting transition between the spring segment 196 and the contact-engaging straight end 180. The transitions provided by offset portions 197–199 step spring arm 190 in a common direction toward spring arm 191 in the manner shown.

Spring arm 191 is formed with two essentially straight segments 200 and 201 and a sharply bent, crooked or offset transition 202 between segments 200 and 201 to step arm 191 toward arm 190. Spring segment 200 lies between nose portion 192 and transition 202, and spring segment 201 lies between transition 202 and the contact pad-engaging end 182 which is rounded or curved as shown. Each of the contact-engaging ends 180 and 182 is preferably bifurcated to provide two coextensive independently deflectible leg portions as shown in FIG. 19A.

Springs 161–163 are of the same construction as that just described for spring 160. Accordingly, like reference numerals have been applied to designate like portions of springs 160–163.

Figure 3A:
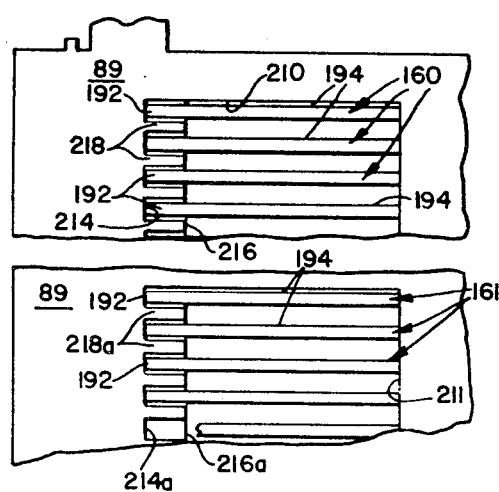
FIG. 3A is an enlarged fragmentary view of the jack construction shown in FIG. 3.

As shown in FIGS. 3 and 4, jack housing 82 is provided with four equally sized rectangular windows or apertures 210, 211, 212 and 213 for receiving springs 160, 161, 162 and 163, respectively. Windows 210 and 211 are formed through side wall 89 and are arranged in aligned relation in such a manner that window 210 opens into socket 70 and window 211 opens into socket 71.

Windows 212 and 213 are on the opposite side of housing 82 from windows 210 and 211 and are formed through side wall 88 at locations where window 212 registers with window 210 and opens into socket 70 and window 213 registers with window 211 and opens into socket 71.

The axis of each plug-receiving socket 70–72 may be assumed to be at the midpoint of the socket equidistant from the corners of the socket. These plug-receiving socket axes are in parallel spaced apart relation and are contained in a common plane extending parallel to the jack housing side walls 88 and 89 and medially intersecting circuit board 94 in parallel relation to the print circuit board's circuit bearing side faces. As will be described in greater detail below the arrangement of springs 160-163 is symmetrical with respect to this plane.

As shown in FIGS. 3, 7 and 8, housing 82 is integrally formed with a contact spring support shelf or ledge 216 extending along and recessed or offset inwardly from the forward edge surface 214 of window 210 which is closest to the front face of housing 82.

The nose portions 192 of springs 160 are received on shelf 216. By this arrangement the ends of spring arms 191 that merge with nose 192 seat on shelf 216.

As shown, springs 160 extend in parallel spaced part relationship rearwardly from the forward window edge 214 and shelf 216. Springs 160 are maintained in this non-contacting parallel spaced apart relationship by a first set of spacer ribs 218, a second set of spacer ribs 219 and a third set of spacer ribs 220. Ribs 218 extend rearwardly from window edge 214 in parallel spaced apart relation along shelf 216. The nose portions 192 of springs 160 lie between ribs 218 as shown.

Ribs 219 are also integrally formed on housing 82 on the interior side of side wall 89 and extend rearwardly from the rear edge of window 210 as best shown in FIG. 7. Ribs 220 extend along a shallow channel 222 which is formed in back plate 119 and which opens into the back plate slot 121.

Referring to FIGS. 3, 7 and 12 the spring arm segment 194 of each of the springs traverses window 210 and 160 extends in a plane that is approximately level with the outer surface of side wall 89 to a point just forwardly of the rearward edge surface 224 of window 210. The offset portions 197 of springs 160 pass through window 210 into the interior of housing 82 in such a manner that spring segments 196 lie within housing 82 and extend rearwardly with respect to window 210 while the spring segments 190 lie in registry with window 210 and are thus exposed for access on the exterior of jack assembly 50. As shown, spring segments 195 lie between and are thus spaced apart by ribs 219.

The transition spring portions 199 offset the contact-engaging ends 180 inwardly toward the printed circuit board 94 and away from the jack housing side wall 89. The end portions 180 of springs 160 extend through the open ended grooves defined by ribs 220 to lie between ribs 220 in contact with the contact pads 166.

As shown in FIG. 7, the inner sharp housing corner defined by the rearward window edge surface 224 seats against the corner juncture 226 that is defined between the transition spring portion 119 and the spring segment 195 in each of the contact springs 160 to flex or deflect each contact spring arm 190 inwardly toward circuit board 94, whereby the flat contact-engaging end 180 of each spring arm 190 is yieldably biased into contact with its associated contact pad 166 on the printed circuit board. As is apparent from the above, the biasing or flexing force exerted by the housing window edge 224 on each contact spring arm 190 is at a point intermediate the opposite ends of the contact spring arm 190.

Still referring to FIG. 7, it will be noted that the contact spring ends 180 extend beyond back plate 119 such that back plate 119 traps the spring ends 180 in the grooves defined by ribs 220.

From its end position on shelf 216 contact spring arm 191 of each spring 160 passes through window 210 and socket 70 to a position where its contact-engaging end 182 seats on its contact pad 166 rearwardly of socket 70. It will be noted that rider boards 170 and 170a are disposed within housing 82 rearwardly of sockets 70-72.

As shown in FIG. 7, only two points of contact or engagement are established between each of the spring arms 191 and the remainder of the jack assembly 50. One of these points is the seating engagement of the forward end of each spring arm 191 or shelf 216. The other point of the engagement is at the curved contact-engaging end 182 where the contact-engaging end seats against its associated contact pad 172 on the rider board 170 within housing 82. Between these two points of engagement each spring arm 191 is free to flex or bow in either direction, that is either towards board 94 or away from board 94. The distance between shelf 216 and the plane containing the rider board contact pads 172 is smaller than the corresponding projected dimension between the opposite ends of each contact spring arm 191 in its relaxed, unflexed condition. Because of this arrangement and because of the two point spring arm engagement described above, the intermediate portion of spring arm 192 lying between end 182 and the other end at nose portion 192 to flex or bow slightly inwardly away from spring arm 190 and towards the printed circuit board 94.

As either one of the patch cord plugs 52 or 53 is inserted into the plug-receiving socket to receive the printed circuit board edge segment 126, the forward, outer corner edge 228 of the plug's rectangular insulating body 130 engages and slides along the segments 200 of spring arms 191, causing the spring arms 191 to flex in the direction opposite to the bow or flexure in FIG. 7, causing the intermediate portions of spring arms 191 to give or flex first before the contact spring ends 182 lift off their respective contact pads 172. This results in a wiping action as will be explained in detail below. As the inward plugging motion of the patch cord plug continues the forward plug body edge 228 travels along the segments 200 of the spring arms 191 to impart a lifting motion to spring arms 191, thereby causing the spring arm ends 182 to lift away from their contact pads 172. Lifting the contact spring ends 182 in this manner electrically disconnects the contact springs 160 from contact pads 172. As shown, each spring arm 191 flexes at the region where it joins to nose portion 192 as it is lifted away from board 94 by the patch cord plug.

Since spring arms 191 are normally flexed towards printed circuit board 94 when no patch cord plug is received in socket 70 and since the intermediate portions of spring arms 191 are flexed by the patch cord plug before their contact-engaging ends 182 lift off their associated contact pads the contact-engaging ends 182 will slide forwardly slightly on their respective contact pads 172 before lifting off to wipe and thereby clean the pads in the process of lifting the contact spring arms away from the contact pads. As the patch cord plug is partially removed from socket 70 the contact spring ends 182 will initially touch down on their respective contact pads 172 and then as the patch cord plug is withdrawn to a further extent, the bow or flexure of the contact spring arms 191 will increase in deflection towards the printed circuit board. This causes the contact spring ends 182 to slide rearwardly on the contact pads 172, whereby further wiping action is achieved to clean the contact pads. Accordingly, insertion and removal of either one of the patch cord plugs 52 or 53 has the effect of causing the contact spring arms 191 to wipe their respective contact pads 172.

Ribs 220 confine the contact spring ends 180 against lateral movement. Engagement of the window edge 224 with the corners 226 on spring arms 190 limits rearward movement of the contact springs and prevents outward movement of the contact springs 160 through window 210, thereby preventing the springs from popping out through the window. Seating engagement of the nose portions 192 on shelf 216 prevents inward movement of the contact springs 160. The window edge surface 214 limits forward movement of the contact springs 160 towards the front of housing 82.

Rather than being affixed by any means such as fasteners or soldering connections it will be appreciated from the foregoing description that contact springs 160 are trapped or confined in place in separable seating surface engagement with the various portions of housing 82 and printed circuit board 94 mentioned above. This unique arrangement simplifies the jack construction, avoids the need for extra fasteners or soldering connections for mounting the contact springs in place and additionally simplifies the assembly and removal of the contact springs.

For example, any one of the contact springs 160 is easily removable simply by first lifting and raising its nose portion 192 out of window 210 to clear the adjacent window edge 214 and then by pulling the contact spring forwardly to slide it out of the housing by way of window 210. Insertion of the contact spring 160 into its operating position in housing 82 is accomplished by simply reversing the process mentioned above.

Because of the foregoing arrangement and construction described above the overall assembly of the component jack parts is also simplified as will be described in greater detail later on.

Ribs 218-220 function to properly align contact springs 160 with their respective contact pads 166 and 172. Ribs 219 and 220 additionally function to guide the contact springs as they are inserted into housing 82 through window 210.

It will be noted that for each contact spring 160 the flexure or deflection of spring arm 191 does not result in flexure or deflection of spring arm 191. The two spring arms therefore act independently of each other.

Spacer ribs, spring-supporting window shelves and back plate channels corresponding to ribs 218-220, shelf 216 and channel 272 are provided for each of the three remaining sets of contact springs 161-163 and are of the same construction as the rib, window shelf and back plate channel construction just described for contact springs 160.

Accordingly, like reference numerals have been applied to designate like ribs, support shelves and back plate channels for the springs 160-163 except that (a) the reference numerals applied to the ribs, shelf and channel for contact springs 161 have been suffixed by the letter a, (b) the reference numerals applied to the spacer ribs, support shelf and channel for contact springs 162 have been suffixed by the letter b, and (c) the reference numerals applied to the spacer ribs, support shelf and channel for contact springs 163 have been suffixed by the letter c to thereby distinguish the various groups of reference numerals from each other.

The configurations of windows 210-213 are also the same. Accordingly, like reference numerals have been applied to designate the front and rear edges for the four windows except that the reference numerals applied to designate the window edges for window 211 have been suffixed by the letter a, the reference numerals applied to the edges of window 212 have been suffixed by the letter b, and the reference numerals applied to the edges of window 213 have been suffixed by the letter c.

Springs 161 are maintained in parallel spaced apart relation and in proper alignment with their associated contact pads 167 and 173 by ribs 218a, 219a and 220a in the same manner just described for springs 160. Similarly, springs 162 are maintained in parallel spaced apart relation and in proper alignment with their associated contact pads 166a and 172a by ribs 218b, 219b and 220b in the same manner previously described for springs 160. Likewise, springs 163 are maintained in parallel spaced apart relation and in proper alignment with their associated contact pads 167a and 173a by ribs 218c, 219c and 220c in the same manner described above for springs 160.

Springs 161-163 are arranged and assembled in the same manner described above for contact springs 160. In particular, springs 161 are received in window 211, springs 162 are received in window 212 and springs 163 are received in window 213.

Being constructed and arranged in the same way as springs 160, the contact spring arms 190 and 191 for springs 161-163 will be biased and deflected in the same manner just described for springs 160. Furthermore, upon insertion of a patch cord plug into socket 70 the spring arms 191 of springs 162 will be lifted to their circuit-breaking positions concomitantly with the spring arms 191 of springs 160 and in the same manner just described for springs 160. Upon insertion of a patch cord plug into socket 71, the spring arms 191 of springs 161 and 163 will be lifted concomitantly to their circuit-breaking positions in the manner described above for springs 160.

Since springs 161-163 are of the same constructions as springs 160 and since springs 161-163 are arranged and assembled in housing 82 in the same manner previously described for springs 160 it will be appreciated that the same contact pad-wiping action previously described for springs 160 is also accomplished with springs 161-163.

As shown in FIG. 7, springs 160 and 162 are symmetrically arranged about a plane medially intersecting sockets 70-72 and effectively containing the printed circuit board 94. By this arrangement the spring arms 191 of contact springs 160 and the spring arms 191 of contact springs 162 converge towards each other in a direction extending towards the rear plate 119 to thereby define an outwardly diverging mouth for receiving the forward nose of the patch cord plug body 130 as the plug is inserted into socket 70. Springs 161 and 163 are symmetrically arranged in the same manner in socket 71.

By virtue of the foregoing symmetrical relationship of springs 160 and 162 in socket 70 it will be appreciated that as either one of the patch cord plugs 52 or 53 is inserted into socket 70 the forward corners 228 and 229 on plug body 130 will concomitantly engage the spring arms 191 on the opposite sides of printed circuit board 94 and thus will travel along the portions of spring arms 191 of springs 160 and 162 in socket 70 to concomitantly lift the spring arms 191 of springs 160 and 162 away from their respective contact pads on the rider board.

Continued inward motion of the patch cord plug body 130 results in the engagement of the forward end of the plug body 130 with the offset spring portions 202 of springs 160 imparting a camming action thereto and causing the corners 230 of these offset portions 202 to ride over the plug body 130 along its outer side face 232 to a position where it registers with a shallow, outwardly-opening, straight flat-bottomed channel or groove 234 which is formed in the outer side face 232 and which extends normal to the contact spring arms 191.

At the same time that the plug body 130 engages the offset spring portions 202 of springs 160, it will also engage the offset spring portions 202 of springs 162, thereby imparting a camming action thereto and causing the corners 230 of springs 162 to ride over the plug body 130 along its other side face 233 to a position where they register with another outwardly opening shallow, flat-bottomed channel or groove 235 which is formed in side face 233 and which corresponds to groove 234.

Thus, upon fully inserting the patch cord plug into socket 70 to its operative circuit-making and circuit-breaking position, the self bias of the spring arms 191 on springs 160 will yieldably urge their corners 230 to seat in the plug body groove 234. At the same time the self bias of the spring arms 191 on springs 162 will yieldably urge their corners 230 to seat in the plug body groove 235 on the opposite side of the plug body. Seating the spring arm corners 230 in the plug body grooves 234 and 235 on opposite sides of the plug body yieldably and releasably locks the patch cord plug in its inserted, operating position in the plug-receiving socket. It therefore will be appreciated that coacting means in the form of the contact spring corners 230 and the plug body grooves 234 and 235 establish a releaseable detent-like lock or latch for releaseably retaining the patch cord plug in its fully inserted position in socket 70.

Exertion of an outward force on the inserted patch cord plug to remove it from socket 70 causes the corners 230 of springs 160 and 162 to cam over the edges of their associated plug body grooves 234 and 235, thus yieldably flexing the arms 191 of springs 160 and 162 to release the patch cord plug for removal from the jack's plug-receiving socket 70. Upon removal of the patch cord plug from socket 70 the arms 191 of springs 160 and 162 will bow or flex inwardly again toward the printed circuit board 94 again, causing the contact ends 182 to touch down on their respective contact pads.

Assembly of the printed circuit board 94 and contact springs 160-163 with housing 82 is accomplished by first positioning back plate 119 in place on the open back of housing 82 and then by slidably inserting the printed circuit board 94 through slot 121 and into housing 82. Thereafter, fasteners 114 and 116 are inserted to fix the printed circuit board 94 to housing 82. After this is done contact springs 160 are assembled with the jack housing and printed circuit board simply by slidably inserting them through window 160 to their operating positions shown in the drawings. Springs 161-163 are assembled in the same manner described above for springs 160 to complete the assembly of the component jack parts.

As best shown in FIG. 10, contact springs 161 and 163 also establish a releaseable lock with either one of the patch cord plugs 52 or 53 upon insertion thereof into socket 71 in the same manner just described for contact springs 160 and 162.

As shown in FIG. 8 the forwardly facing edge surfaces of spacer ribs 219, 219a, 219b and 219c lie in a common plane normally intersecting the longitudinal axes of the plug-receiving sockets 70 and 71. The forwardly facing edge surfaces of ribs 219 and 219a are indicated at 237 and limit the inward movement of either of the patch cord plugs 52 or 53 into socket 70 to thereby define the rearward end of socket 70.

As shown in FIG. 10, the forwardly facing edge surfaces of ribs 219b and 219c are indicated at 239 and simiarly limit the inward movement of either one of the patch cord plugs 52 or 53 into socket 71 to thereby define the rearward end of socket 71.

It will be appreciated that a unitary multi-layer printed circuit board having alternate layers of insulating material and printed circuitry may be used in place of the rider board assemblies 99 and 100 and printed circuit board 94 to provide the previously described printed circuit patterns.

It will be noted that in practice some of the segments of the rider board conductors 186 extend along the underside of board 170 to avoid interference between the printed circuitry on the rider board. The same applies to the conductors on rider board 170a.

From the foregoing description it also will be appreciated that the electrical jack of this invention has relatively few parts, is compactly and efficiently organized to define a relatively small overall package, is inexpensive to manufacture and easy to assemble, and assures positive and reliable circuit-making and circuit-breaking operations upon insertion of a patch cord plug into any one or more of the three patch cord plug-receiving sockets. Additionally, it will be noted that various features of this invention may be used with either one or both of the patch cord plug-receiving sockets 70 and 71 apart from the non-switching monitoring socket 72.

As compared with the first jack construction embodiment just described, the embodiment shown in FIGS. 22-33 is modified to eliminate the rider board assemblies 99 and 100 and to reduce the number of contact springs in each of the four sets of springs 160-163 by one half without reducing the number of normal through circuits or current conducting paths through the jack assembly. This is mainly accomplished by providing the second embodiment with a pair of pivotal one-piece flaps 250 and 252 and by modifying the printed circuits on both sides of the printed circuit board 94 in a manner to be described in detail below. For the most part the jack construction shown in FIGS. 22-35 is otherwise the same as the jack construction illustrated in FIGS. 2-14. Like reference numerals have therefore been used to designate like parts or components of the two jack assembly embodiments except that the reference numerals applied to designate the component parts of the second jack embodimemt have been primed to distinguish them from the reference numerals used for the first embodiment.

The finger stock on printed circuit board 94' may be the same as fingers 138-143 on board 94. Accordingly, like reference numerals have been applied to designate like fingers except that the reference numerals for the fingers on board 94' have also been primed to distinguish them from the reference characters used in the first illustrated jack embodiment. Fingers 138'-143' are arranged in the same way as previously described for fingers 138-143. FIGS. 34 and 35 show only four of the fingers in each of the six sets of fingers 138', 139', 140', 141', 142' and 143' together with corresponding numbers of connector terminals and printed circuit tracks to simplify the schematic circuit diagram.

In FIGS. 34 and 35 the terminals of connector 56' are indicated at 294, 295, 296, 297, 294a, 295a, 296a and 297a, and the terminals in connector 57' are indicated at 298, 299, 300, 301, 298a, 299a, 300a and 301a. As shown in FIG. 34, a printed circuit 303 provides the various circuit connections to fingers 138'–140', connector terminals 294–301 and contact springs 160' and 161'. As shown in FIG. 35, a further printed circuit 303a provides the various circuit connections to fingers 141'–143', connector terminals 294–301a and contact springs 162' and 163'. Circuit 303 and 303a are applied directly to board 94'.

Each of the fingers 138' is connected by way of a separate printed circuit conductor or track 290 to a different one of the terminals 294–297 in connector 56'. Similarly, each of the fingers 139' is connected by way of a separate printed circuit conductor or track 292 to a different one of the terminals 298–301 in connector 57'.

In addition to conductors 290 and 292 the printed circuit pattern 303 is provided with a first set of contact pads 306 (individually indicated at 306-1 and 306-2 in FIG. 34), a second set of contact pads 307 (individually indicated at 307-1 and 307-2 in FIG. 34), a third set of contact pads 308 (individually indicated at 308-1 and 308-2 in FIG. 34), and a fourth set of contact pads 309 (individually indicated at 309-1 and 309-2 in FIG. 34). Each of the contact pads 308 forms a part of a different one of the conductors 292. Each of the contact pads 307 is connected by way of a branch of a different one of the conductors 290 to a different one of the terminals connectors 294–297 as shown.

In the simplified diagram shown in FIG. 34 only two of the contact springs 160' and only two of the contact springs 161' are shown, this being all that is needed to establish the four normal through circuits normally connecting the four connector terminals 294–297 to the four connector terminals 298–301, respectively. The two contact springs 160' illustrated in FIG. 34 are individually indicated at 160'-1 and 160'-2. Similarly, the two contact springs 161' in FIG. 34 are individually indicated at 161'-1 and 161'-2.

Contact spring 160'-1 has its stationary end or tail 180' seated on contact pad 306-1 and its deflectible end 182' normally seated on contact pad 308-1 thus completing a normal through circuit between connector terminals 294 and 298. Similarly, contact spring 160'-2 has its stationary end 180' seated on contact pad 306-2 and its deflectible end 182' normally seated on contact pad 308-2, thus completing a normal through circuit interconnecting terminals 295 and 299. In a similar fashion contact spring 161'-1 has its stationary end 180' seated on contact pad 307-1 and its deflectible end 182' normally seated on contact pad 309-1 to thus normally connect connector terminal 296 to connector terminal 300. In a like fashion contact spring 161'-2 has its stationary end 180' seated on contact pad 307-2 and its deflectible end 182' normally seated on contact pad 309-2 to thereby normally interconnect connector terminals 297 and 301.

As will be described in greater detail below, flap 250 is interengaged with the two sets of contact springs 160' and 161' and is pivoted by insertion of a patch cord plug into either one of the plug-receiving sockets 70' and 71' to deflect the deflectible ends 182' of both sets of contact springs 160' and 161' away from their respective contact pads to their circuit-opening positions. As a consequence, the circuit connections between terminals 294–297 and terminals 298–301 will be broken.

As shown in FIG. 34, each of the terminals of conductor 57' may be connected to a different one of the fingers 140' by way of a separate printed circuit conductor or track 320 to thus establish the monitoring circuit connection similar to that described for socket 72 in the first jack embodiment.

As illustrated in FIG. 34, each of the terminals in connector 56' is connected to its associated terminal in connector 57' by way of only one contact spring rather than two springs as is the case in the first jack embodiment shown in FIG. 1A. As a result, the total number of contact springs 160'–163' can be reduced by one half without reducing the number of normal through circuits or current conducting paths which are provided in the jack for interconnecting the terminals of connectors 56' and 57'. For example, only six of the contact springs 160' and six of the contact springs 161' are needed for establishing twelve normal through circuits in the jack.

As will be appreciated from the schematic shown in FIG. 34, the various printed circuit conductors 290, 292 and 320 will each be divided into different segments, some being located on one side of the printed circuit board 94' and others being located on the opposite side of the printed circuit board 94' to establish the illustrated circuit connections without having the different conductors interfere with one another. It also will be appreciated that any suitable pattern or arrangement of printed circuit conductors 290, 292 and 320 may be utilized in conjunction with the principles of this invention, the one shown in the drawings being merely illustrative.

Referring to FIG. 35 the printed circuit pattern 303a for making the various circuit connections to fingers 141'–143', connector terminals 294a–301a and contact springs 162' and 163' may be the same as the printed circuit pattern 303 shown in FIG. 34. Accordingly like components of the printed circuits 303 and 303a have been identified by like reference numerals except that the reference numerals used to identify the components of printed circuit 303a have been suffixed by the letter a to distinguish them from the reference numerals used in conjunction with the printed circuit 303.

From the foregoing it will be appreciated that each of the fingers 141' is connected by way of a separate printed circuit conductor 290a to a different one of the connector terminals 294a–297a and further that each of the fingers 142' is connected by way of a separate one of the conductors 292a to a different one of the connector terminals 298a–301a. Furthermore, each of the fingers 143' is connected by way of a separate one of the conductors 320a to a different one of the connector terminals 298a–301a.

In FIG. 35 only two of the contact springs 162' and only two of the contact springs 163' are shown for purposes of simplification similar to the schematic in FIG. 34. The two contact springs 162' illustrated in FIG. 35 are individually indicated at 162'-1 and 162'-2. Similarly, the two contact springs 163' in FIG. 35 are individually indicated at 163'-1 and 163'-2.

Similar to the circuit description for FIG. 34 it is apparent from FIG. 35 that contact spring 162'-1 lies in contact with contact pads 306-1a and 308-1a, that contact spring 162'-2 lies in contact with pads 306-2a and 308-2a, that contact spring 163'-1 lies in contact with pads 307-1a and 309-1a, and that contact spring 163'-2 lies in contact with pads 307-2a and 209-2a. Each of the connector terminals 294a–297a is connected by a separate one of these contact springs to the terminals 298a–301a, respectively. Thus each normal through circuit in the printed circuit pattern 303a contains only one contact spring as is the case with printed circuit pattern 303.

As will be described in detail below flap 252 is engaged with the two sets of contact springs 162' and 163' and is pivoted by insertion of either one of the patch cord plugs 52 or 53 into either one of the plug-receiving sockets 70' or 71' to deflect the deflectible ends 182' of both sets of contact springs 162' and 163' away from their respective contact pads to their circuit-opening positions. All of the circuits normally interconnecting the terminals of connectors 56' and 57' will therefore be opened or broken by insertion of either one of the patch cord plugs 52 or 53 into either one of the plug-receiving sockets 70' or 71'.

Additionally, insertion of either one of the patch cord plugs into socket 70' results in the electrical connection of each of the plug's contact elements 134 and 136 to a different one of the terminals in connector 56' by way of the previously described printed circuit connections. Furthermore, insertion of either one of patch cord plugs into the plug-receiving socket 71' results in the electrical connection of each of the plug's contact elements 134 and 136 to a different one of the terminals in connector 57' by way of the circuit connections in printed circuit 303 and 303a.

Figure 22:
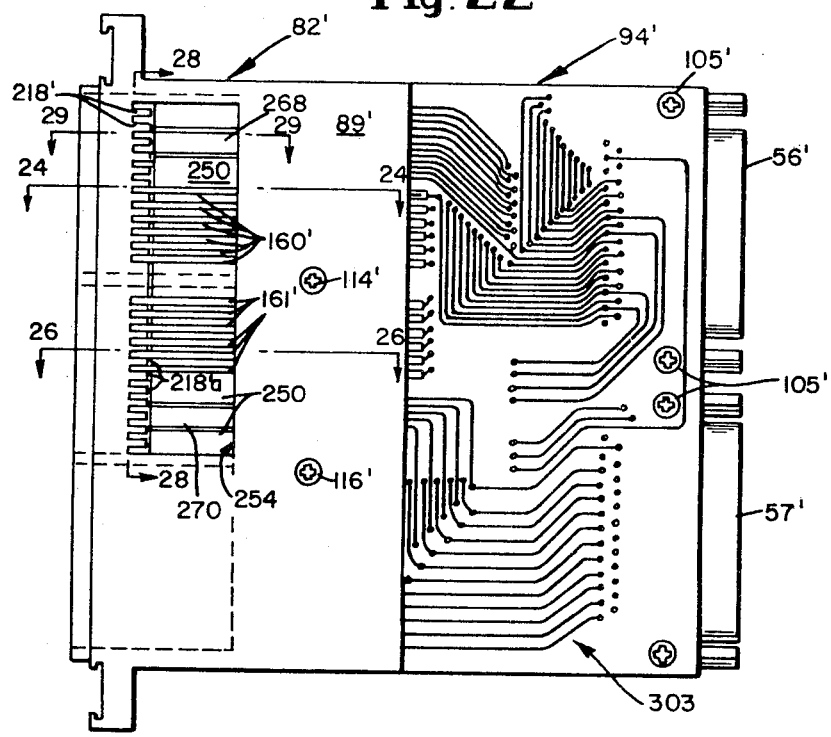
FIG. 22 is a left hand side elevation of a second electrical jack embodiment incorporating additional principles of this invention.
Figure 22A:
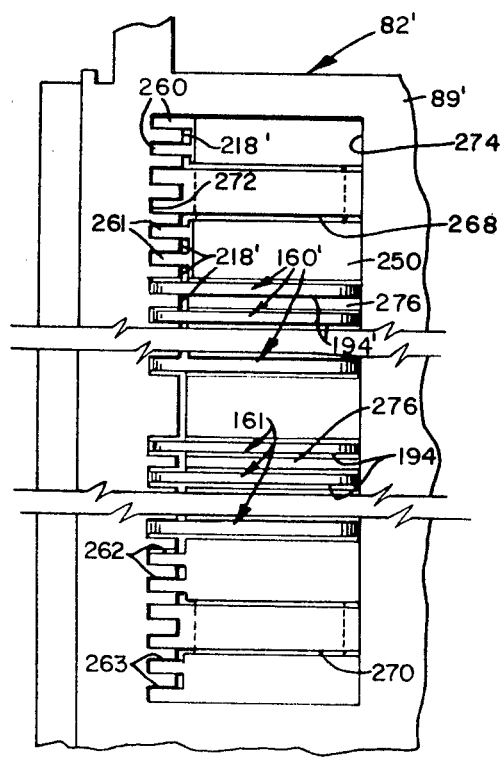
FIG. 22A is a fragmentary enlargement of FIG. 22.
Figure 23:
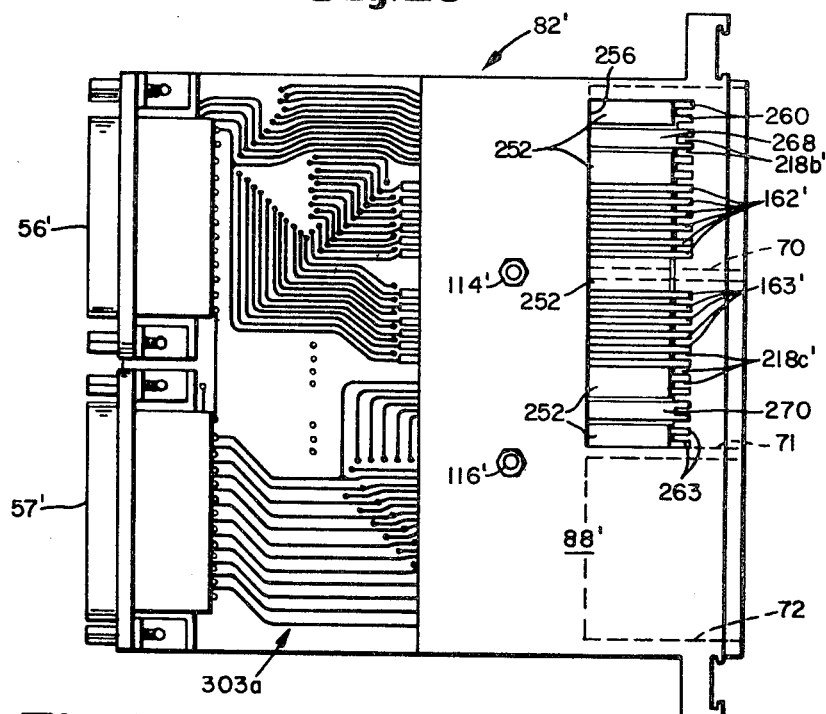
FIG. 23 is a right hand side elevation of the electrical jack shown in FIG. 22.

Referring to FIGS. 22 and 23, housing 82' is the same as housing 82 except that the previously described pair of spring-receiving windows on the left side have been merged to form a single window 254 through the housing side wall 89. On the opposite side of housing 82' the previously described pair of spring-receiving windows have also been merged to form a single window 256 through housing side wall 88. Window 254 opens into sockets 70' and 71' on one side of the housing, and window 256 also opens into sockets 70' and 71' on the opposite side of the jack housing in registry with window 254.

As shown in FIG. 22 flap 250 is received in window 254 and is formed with a ribbed body portion 258 and four pairs of pivot arms 260, 261, 262 and 263 extending from the forward edge of the flap. Pivot arms 260–263 are slidably received in separate grooves that are formed between the ribs 218' on window shelf 216'. The pivot arms of each pair are spaced apart by the width of one of the ribs 218' to receive one of the ribs. By this construction flap 250 is pivotable about an axis normally intersecting ribs 218' and pivot arms 260–263 and extending parallel to the front and rear edges of window 254 and to a medial plane containing the longitudinal axes of sockets 70'–72'. The pivot axis of flap 250 is perpendicular with respect to springs 160' and 161'.

In addition to pivot arms 260–263 flap 250 is also integrally formed with two pairs of guide arms 264 and 265 projecting rearwardly from the rearwardly facing edge of flap body 258 to slidably receive different ones of the jack housing spacer ribs 219'. As shown in FIGS. 24–27 flap 250 is pivotable between two angularly spaced apart positions. In one position flap 250 is pivoted inwardly to extend into sockets 70' and 71'. In the other position flap 250 is pivoted outwardly to a position where it is out of sockets 70' and 71' and about flush with the outer surface of the jack housing side wall 89'. Partition wall 90' is notched or cut out at 267 to form a recessed region that allows flap 250 to be pivoted into sockets 70' and 71' without interference. A pair of bars 268 and 270 keep flap 250 from canting and from tilting out of window 254 at its upper or lower ends upon insertion of a plug into either one of the sockets 70' or 70'. Bars 268 and 270 may be formed from any suitable electrical insulating material and are suitably supported on the housing side wall to span window 254 between the window's forward and rearward edges 272 and 274 at right angles thereto.

As shown, flap 250 extends full length of window 254 from the upper edge thereof to the lower edge thereof. Additionally, flap 250 is disposed between the spring arms 190' and 191' of contact springs 160' and 161'. More specifically, flap 250 lies between the spring segments 194' of contact springs 160' and 161' on its outer side and the spring segments 200' of contact springs 160' and 161' on its inner side.

The outwardly facing side of flap 250 may be formed with straight parallel spaced apart stiffening ribs 276. As flap 250 is pivoted outwardly the straight spring segments 194' of springs 160' and 161' will be received between ribs 276 to thereby lie between ribs 276. The outward pivotal movement of flap 250 will not result in the deflection of spring arms 190'.

The inner side of flap 250 is also formed with a group of straight parallel spaced apart stiffening ribs 278 to form a group of parallel spaced apart grooves 280. Ribs 278 extend parallel with ribs 276 and with the spring arms 191' of contact springs 160' and 161'. An aperture 282 is located at the rearward end of each of the grooves 280 and is formed through the flap's rearward edge portion 284.

The spring arm segment 200' of each of the contact springs 160' and 161' is seated in a different one of the flap's grooves 280 on the inner side of flap 250. These spring arm segments 200' thus lie between and are spaced apart by the ribs 278 on the inner side of flap 250. The spring arm transition portion 202' at the rearward end of each spring arm segment 200' slidably passes through the aperture 282 at the end of its associated groove 280. By this arrangement the spring segments 201' of contact springs 160' and 161' overlie and are disposed outwardly of the rearward flap edge portion 284 which lies rearwardly of the straight row of apertures 282. By this construction the spring arms 191' of contact springs 160' and 161' link or interengage with flap 250 at its rearward edge remote from its pivot axis. The nose portions 192' of contact springs 160' and 161' extend around the forwardly facing pivot edge of flap 250 as shown.

Apart from their interengagement with flap 250, contact springs 160' and 161' are arranged in housing 82' and are flexed in the same manner described from springs 160 and 161 in the first embodiment. The spring arms 191' of contact springs 160' and 161' are therefore normally bowed or flexed inwardly toward the printed circuit board 94' in the same manner as spring arms 191 in the first jack embodiment. As a result, the spring arm segments 201' of contact springs 160' and 161' bear against the rearward edge portion 284 of flap 250 to yieldably urge and thus pivot flap 250 inwardly to the position where it normally extends into the plug-receiving sockets 70' and 71' when no patch cord plug is received in either one of the sockets 70' or 71'.

Flap 252 is of the same construction as flap 250. Accordingly, like reference numerals have been applied to designate like portions of the two flaps.

As shown in FIG. 23 flap 252 is arranged and pivotally mounted in window 256 in the same manner just described for flap 250. Furthermore, the arrangement of flap 252 with contact springs 162' and 163' is the same as the arrangement just described for flap 250 and contact springs 160' and 161'. Contact springs 162' and 163' are arranged in housing 82' in the manner described in the first embodiment. The pivot axes of flaps 250 and 252 are in parallel spaced apart relation with each other and are arranged in a common plane normally intersecting the longitudinal axes of sockets 70'-72'. Partition wall 90' is notched or cut away at 269 to define a recessed region that permits flap 252 to be pivoted into sockets 70' and 71' without interfering with the partition wall.

By the foregoing construction it will be appreciated that flap 252 is pivoted inwardly under the bias exerted by the contact spring arms 191' of springs 162' and 163' when no patch cord plug is received in either one of the sockets 70' or 71'. Accordingly, flaps 250 and 252 converge toward each other in a rearwardly extending direction to define an outwardly diverging open mouth within sockets 70' and 71' for receiving either one of the plugs 52 or 53 upon insertion thereof into either one of the sockets 70' or 71'. As shown, flaps 250 and 252 together with their associated contact springs are symmetrically arranged on opposite sides of a plane containing the longitudinal axes of sockets 70'-72' and medially intersecting the printed circuit board 94' in parallel relation with the oppositely facing circuit-bearing sides thereof.

As either one of the patch cord plugs 52 or 53 is inserted into socket 70', the forward corners 228 and 229 on plug body 130 will concomitantly engage flaps 250 and 252 along the inwardly facing sides thereof and thus will travel along the inwardly facing sides of flaps 250 and 252 to pivotally urge flaps 250 and 252 outwardly in opposite directions and away from each other to their extreme positions where they lie outwardly of sockets 70' and 71' within windows 254 and 256, respectively.

The outward pivotal motion that is imparted to flap 250 by insertion of a patch cord plug into either one of the sockets 70' or 71' will be against the bias of the spring arms 191' of springs 160' and 161' and will flex and lift these spring arms 191' in unison away from their respective contact pads on the printed circuit board 94', thereby electrically disconnecting the connector terminals 294-297 from the connector terminals 298-301. At the same time the outward pivotal motion imparted to flap 252 by the insertion of a patch cord plug into either one of the sockets 70' or 71' will flex and lift the contact spring arms 191' of contact springs 162' and 163' off their respective contact pads on the printed circuit board 94' in a similar manner to thereby electrically disconnect the connector terminals 294a–297a from the connector terminals 298a–301a. Insertion of either one of the patch cord plugs 52 or 53 into either one of the plug-receiving sockets 70' or 71' therefore results in the electrical disconnection of the terminals of connector 56' from the terminals of connector 57'. When the patch cord plug is in its fully inserted circuit-making and circuit-breaking position within either one of the sockets 70' and 71' flap 250 will lie in window 254 against the side face 232 of the plug body 130, and flap 252 will similarly lie in window 256 against the side face 233 of plug body 130.

Figure 24:
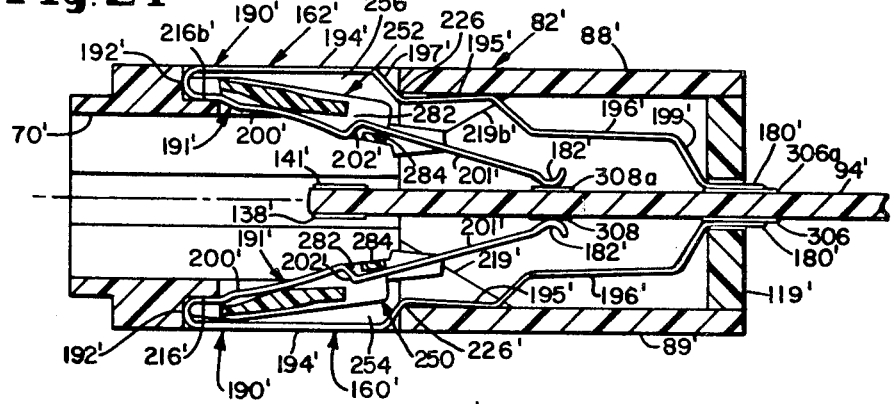
FIG. 24 is a section taken substantially along lines 24—24 of FIG. 22.
Figure 25:
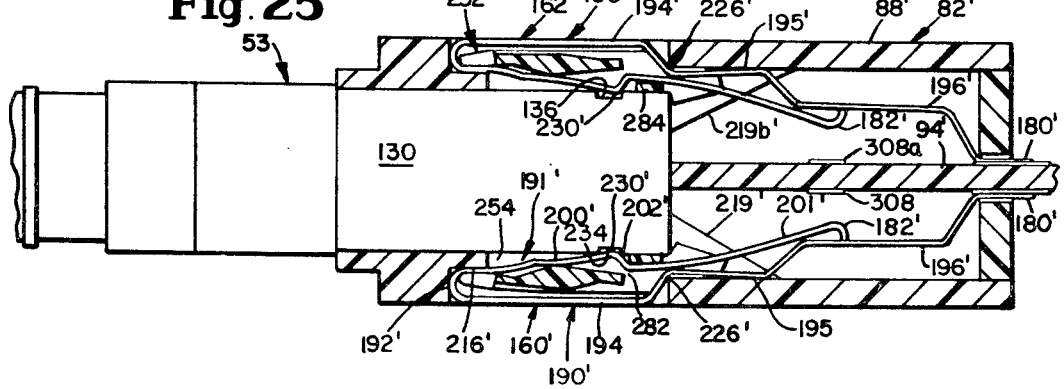
FIG. 25 is a section similar to FIG. 24, but showing a patch cord plug inserted into the uppermost one of the three plug-receiving sockets in the jack assembly.
Figure 28:
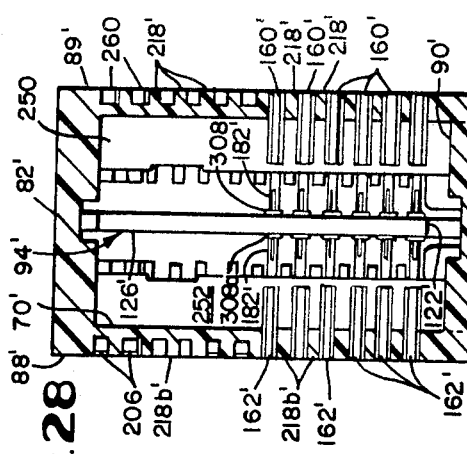
FIG. 28 is a section taken substantially along lines 28—28 of FIG. 22.
Figure 26:
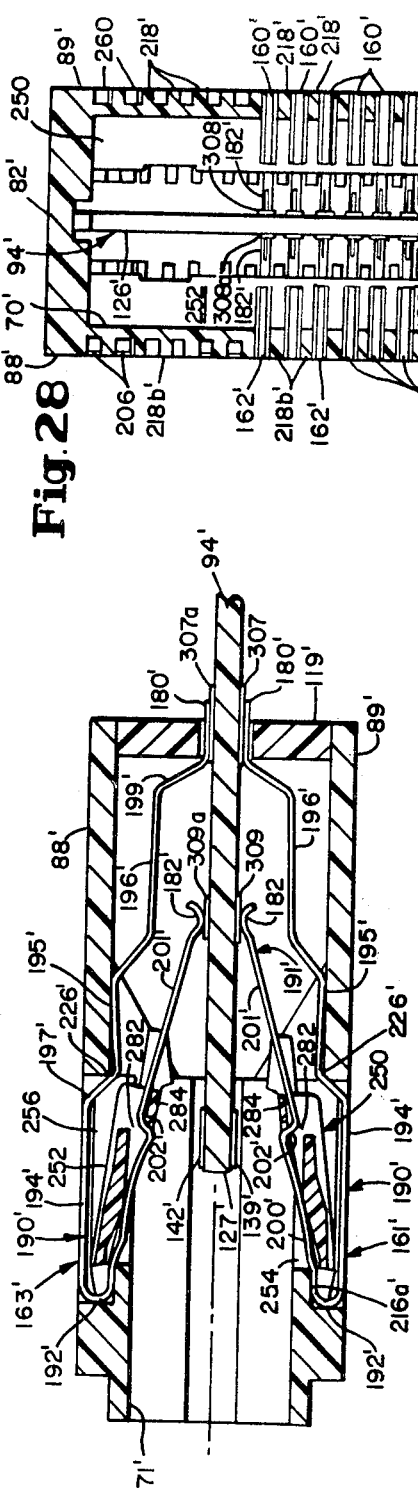
FIG. 26 is a section taken substantially along lines 26—26 of FIG. 22.
Figure 27:
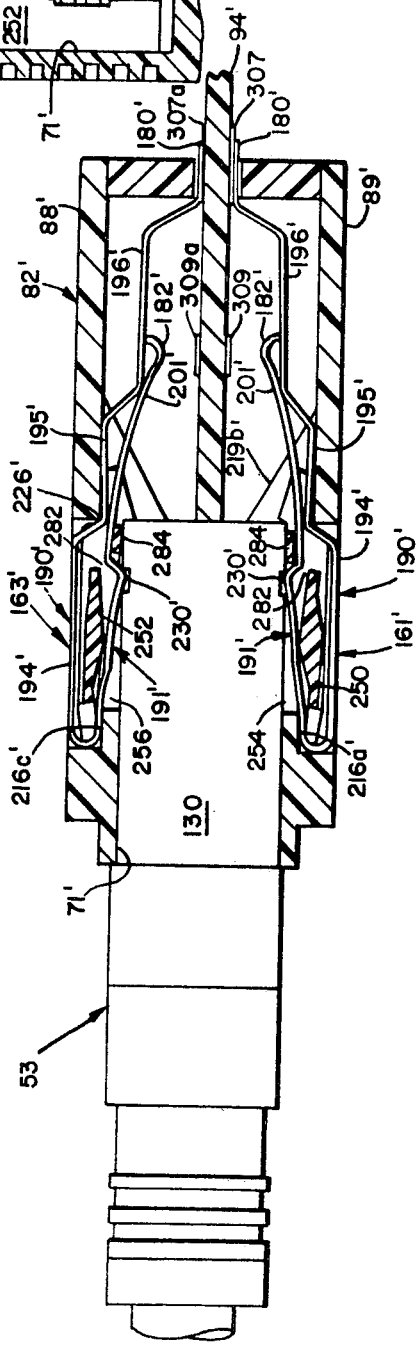
FIG. 27 is a section similar to FIG. 26, but showing a patch cord plug inserted into the middle or intermediate plug-receiving socket of the jack assembly.
Figure 29:
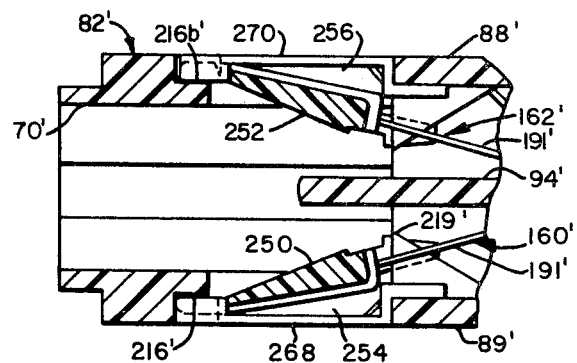
FIG. 29 is a section taken substantially along lines 29—29 of FIG. 22.
Figure 30:
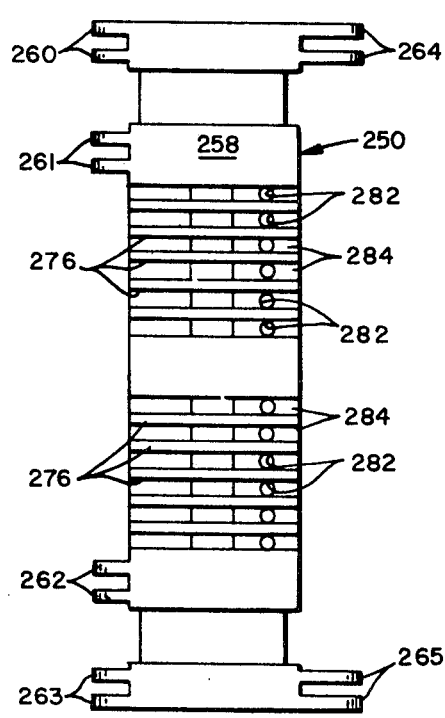
FIG. 30 is a plan view showing the outer side of one of the contact spring-engaging flaps.
Figure 31:
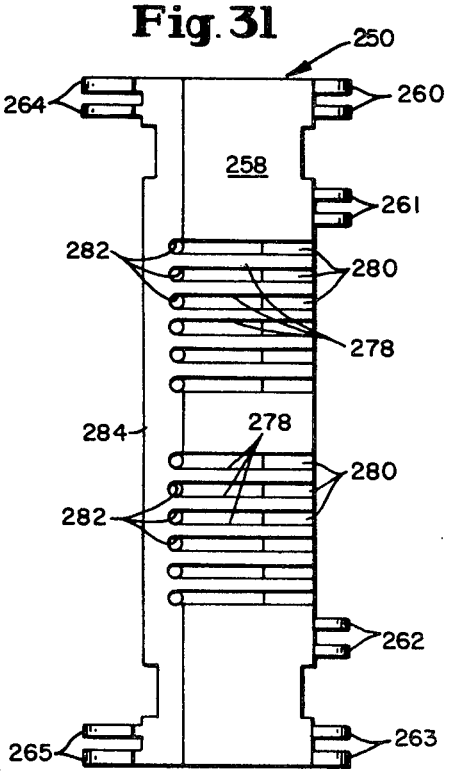
FIG. 31 is a plan view showing the inner side of one of the flaps.
Figure 32:
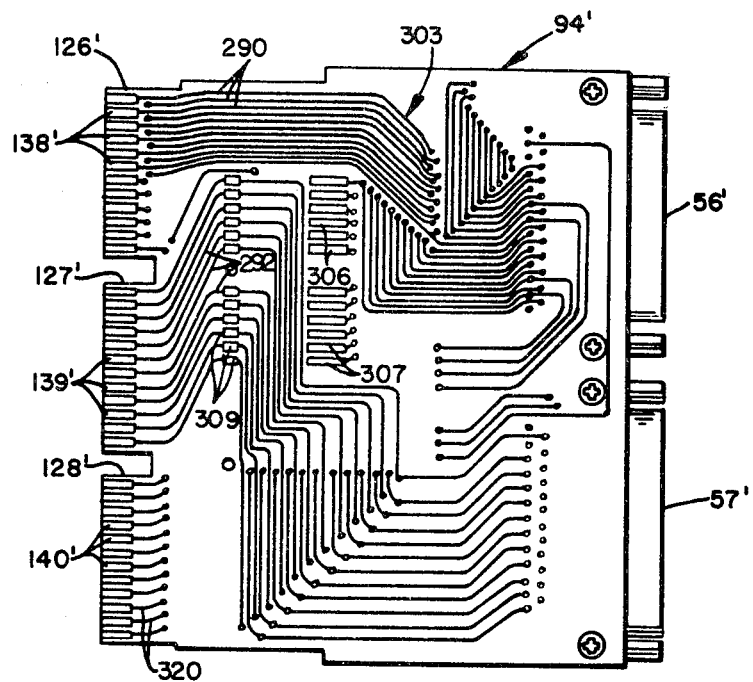
FIG. 32 is a left hand side elevation of the printed circuit board shown in FIG. 22.
Figure 33:
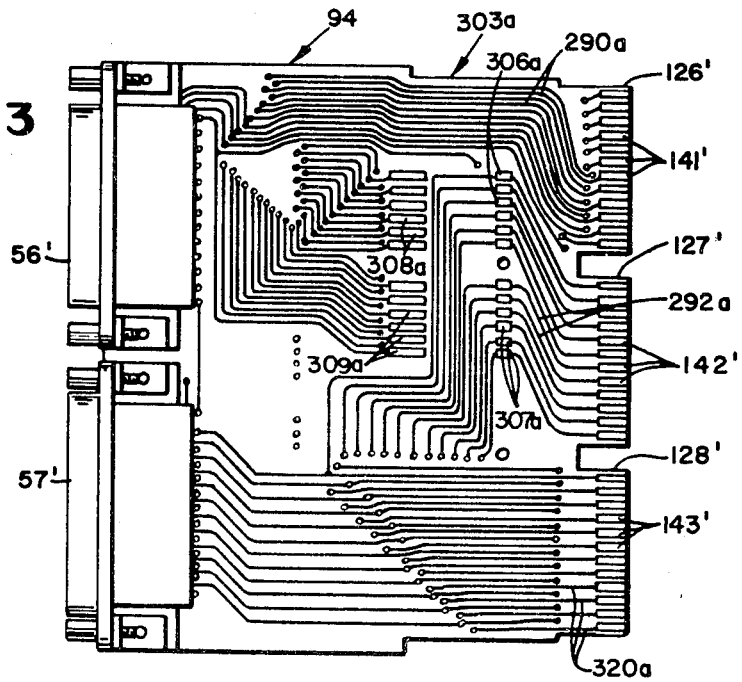
FIG. 33 is a right hand side elevation of the printed circuit board shown in FIG. 22.

When the patch cord plug is removed from the plug-receiving socket, the bias exerted by the spring arms 191' of springs 160' and 161' will bias flap 250 inwardly, causing it to pivot about its pivot axis to its position shown in FIGS. 24 and 26 where it extends into sockets 70' and 71'. Removal of the patch cord plug will also result in the pivotal movement of flap 252 about its pivot axis under the bias exerted by the spring arms 191' of springs 162' and 163' thus urging flap 252 to its position where it also extends into sockets 70' and 71' as shown in FIGS. 24 and 26.

The contact-engaging ends 182' of springs 160'-163' will wipe their respective contact pads as they lift off the contact pads and also as they touch down on the contact pads in the same manner described in the first jack embodiment. Additionally, the corners 230' of contact springs 160' and 162' will seat in the plug body grooves 234 and 235 upon insertion of either one of the patch cord plugs 52 or 53 into socket 70' to releaseably lock the plug within socket 70' in the same manner described in the preceding embodiment. Likewise, the corners 230' of contact springs 161' and 163' will seat in the plug body grooves 234 and 235 upon insertion of either one of the patch cord plugs 52 or 53 into socket 71', thereby releasably locking the patch cord plug within socket 71' in the manner as previously described.

From the foregoing description it will be appreciated that the contact springs 160'-163' and the flaps 250 and 252 form a switching means in which the contact springs 160'-163' constitute the switching elements and in which the flaps 250 and 252 constitute switch actuators for actuating the switching elements to their circuit-breaking positions by insertion of a patch cord plug into either one of the sockets 70' or 71'. In the first jack embodiment the switching means has no separate actuator and comprises the contact springs 160-163 which are operated or actuated by direct engagement with the patch cord plug's insulating, contact-carrying body 130.

The type of plug used with the jack of this invention may be referred to as a printed circuit board edge connector or a card edge connector. Coacting rib and groove formations may be formed on the jack housing and the patch cord plug for keying the patch cord plug so that it can be inserted in only one single predetermined orientation into any one of the three plug-receiving sockets 70'-72'.

In assembling the component parts of the jack shown in FIGS. 22-33, springs 160' and 161' may first be assembled or mounted on flap 250 by threading the spring arms 191' through apertures 282. The sub-assembly of flap 250 and springs 160' and 161' then is inserted as a unit into window 254 after board 94' is inserted and fixed to housing 82' to properly position flap 250 and springs 160' and 161' on the jack housing. Bars 268 and 270 are then mounted in place in window 254. Flap 252 and springs 162' and 163' may be assembled in the same manner as described above.

Referring to FIGS. 15-19 and 19A plug body 130 has a hollow interior and is formed with a contact-mounting portion 330 and a cable-receiving collar portion 332 extending rearwardly from the contact-mounting portion 330 at the end of body 130 which is opposite from the body's open card-receiving end. Contacts 134 and 136 are suitably mounted in spaced apart relation in portion 330. The multi-conductor cable 54 extends coaxially through collar portion 332 to provide for the connection of its conductors to contact elements 134 and 136.

Collar portion 332 is interiorly formed with a cable-anchoring strain relief configuration comprising a series of threads 334 and a pair of diametrically opposed inwardly opening grooves or channels 336 and 338. Grooves 336 and 338 and threads 334 are formed on the inner cable-engaging periphery of collar portion 332. As shown, grooves 336 and 338 extend longitudinally with respect to the longitudinal axis of collar portion 332 and hence with respect to the axis of the straight cable portion received in collar portion 332.

Threads 334 are disposed inwardly of the rearward end of collar portion 332 and are disposed between two cylindrically smooth, uniformly diametered, cable-receiving bore portions 339 and 341 in collar portion 332. The set of threads 334 thus interrupt the smooth walled passage through collar portion 332 as shown. The diameters of bore portions 339 and 341 are equal and greater than the internal crest diameter of threads 334 but smaller than the internal root diameter of threads 334. The internal diameters of bore portions 339 and 341 may be about equal to the diameter at the pitch line of threads 334.

As shown in FIGS. 15, 17, 18, 19 and 19A plug body 130 is longitudinally divided into two one-piece complementary halves or shells 340 and 342. Shells 340 and 342 are separately molded from any suitable electrical insulating material and are secured together by suitable fastener means such as screw and nut assemblies 344. Shells 340 and 342 abut along an interface that is contained in a plane medially intersecting portions 330 and 332 and containing the longitudinal axis of collar portion 332 such that the two shells form complementary halves of portion 330 and also complementary halves of portion 332. Threads 334 are therefore divided into two complementary diametrically opposed segments 346 and 348 each having an arcuate extent of 180°.

As shown in FIGS. 19 and 19A groove 336 interrupts the thread segments 346, and groove 338 interrupts the thread segment 348. A plane medially intersecting both of the grooves 336 and 338 normally intersects the plane containing the interface between shells 340 and 342.

The internal diameters of the bore portion 339 and 341 is about equal to the outer diameter of cable 54 in its uncompressed, relaxed condition. The crest diameter of threads 334 is therefore significantly less than this uncompressed outer cable diameter.

In order to assemble the component parts of the patch cord with the plug construction shown in FIGS. 15-19, the circuit connections are first made between the conductors of cable 54 and contacts 134 and 136, and the unstripped portion of the cable with the outer sheath thereon is laid in place on one of the complementary halves of collar portion 332. The two complementary shells 340 and 342 are then tightly secured together by the screws 344 to firmly clamp the unstripped portion of cable 54 between the complementary halves of collar portion 332.

Because the crest diameter of threads 334 is significantly less than the uncompressed outer diameter of cable 54 the plastic deformable outer cable sheath (indicated at 350 in FIGS. 8 and 10) is deformed or extruded into the inwardly opening roots of threads 334 and also into the inwardly opening grooves 336 and 338. Threads 334 thus grip and anchor cable 54 in collar portion 332 to resist tensioning forces that may be applied to the cable to pull the cable out of the plug body 130. The deformation or extrusion of the cable sheath 350 into grooves 336 and 338 provide a strain relieving interlock or anchor resisting twisting or turning of cable 54 in collar portion 332. Thus, the interlock established between the outer cable sheath and threads 334 and grooves 336 and 338 resists axial withdrawl of the cable and twisting or turning movement of the cable in collar portion 332.

As explained above contact springs 160-163 and 160'-163' are each individually removable from their jack assemblies without requiring the removal of any other part, without requiring any disassembly of the jack and without requiring the disconnection of any connections such as soldering connections or the like. This special contact spring removal feature permits the quick and easy removal of defective spring members. It is especially useful in situations where one or more springs are found to be defective upon completing the assembly or are damaged in the course of assembly with the other jack parts and thus require replacement before use or shipment to a customer.

In practice leads may be used to connect the various printed circuit conductors (particularly the ends of these conductors) to the terminals in connectors 56, 57, 56' and 57' themselves. The portions of the printed circuit conductors that connect to these leads or to other non-printed circuit terminals are considered to be terminal portions. The printed circuits described above therefore have various sets of terminal portions corresponding in number to the terminals within connectors 56, 57, 56' and 57'.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description, and all changes which come within the meaning and range of equivalency of the claims are therefore intended to be embraced therein.

What is claimed and desired to be secured by Letters Patent is:

1. A patch cord comprising a plural-conductor cable and a plug, said cable having a plurality of conductors and a plastic deformable sheath circumferentially surrounding said conductors, said plug having (a) a hollow exterior insulating body and (b) a plurality of contact elements mounted in an interior space of said body and connected to the conductors of said cable, said body having a cable-receiving collar portion at one end thereof, said cable extending through said collar portion and into said interior space, said collar portion circumferentially surrounding said cable, and at least said collar portion being longitudinally divided into separately formed complementary shells, means for circumferentially drawing said shells together and for fixing said shells together at positions where said shells abut against each other along a plane containing the longitudinal axis of said collar portion, internal arcuately contoured formations formed on the inner peripheries of said shells, each of said formations partially circumferentially surrounding the cable sheath, and each of said formations having a serrated configuration in longitudinal cross section to form alternate crests and valleys, the crests in each of said formations having a common diameter which is less than the outer diameter of said cable to grip said cable and to cause the sheath of said cable to deform into the valleys of said internal formations as said shells are circumferentially drawn together for anchoring said cable against forces tending to pull the cable out of said plug, said shells abutting against each other along regions lying beyond said internal formations upon being circumferentially drawn together, and a narrow inwardly opening longitudinal groove formation formed on the inner periphery of at least one said shells and interrupting the internal arcuately contoured formation on the inner periphery of said one of said shells, said groove formation lying between the extremities of the internal arcuately contoured formation on the inner periphery of said one of said shells, and said groove formation extending radially to a region lying radially outwardly of the valleys in the internal arcuately contoured formation in said one of said shells, the sheath of said cable being deformed into said groove formation as said shells are circumferentially drawn together to said positions to resist turning movement of the cable relative to said collar portion, said longitudinal groove formation being free of any protrusions capable of penetrating said sheath upon fixing said shells together.

2. The patch cord defined in claim 1 wherein said internal formations are thread formations.

* * * * *